(12) United States Patent
Wada et al.

(10) Patent No.: US 8,358,008 B2
(45) Date of Patent: Jan. 22, 2013

(54) SEMICONDUCTOR DEVICE

(75) Inventors: Makoto Wada, Kanagawa (JP); Noriaki Matsunaga, Kanagawa (JP); Yosuke Akimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 12/726,520

(22) Filed: Mar. 18, 2010

(65) Prior Publication Data

US 2011/0006425 A1 Jan. 13, 2011

(30) Foreign Application Priority Data

Jul. 13, 2009 (JP) ................. 2009-164993

(51) Int. Cl.
*H01L 23/532* (2006.01)
(52) U.S. Cl. ................. 257/750; 257/222; 257/E23.165
(58) Field of Classification Search .................. 257/750, 257/E23.165, 24, 222; 977/734
See application file for complete search history.

(56) References Cited

U.S. PATENT DOCUMENTS

| 7,015,142 | B2 | 3/2006 | DeHeer et al. |
| 7,728,405 | B2 * | 6/2010 | Kreupl .......................... 257/528 |
| 2006/0086958 | A1 | 4/2006 | Eimori |
| 2007/0287011 | A1 | 12/2007 | DeHeer |
| 2009/0257270 | A1 * | 10/2009 | Schricker et al. ............. 365/148 |

FOREIGN PATENT DOCUMENTS

| JP | 2006148063 | 6/2006 |
| JP | 2010-212619 | 9/2010 |

OTHER PUBLICATIONS

Tse, et al.; Ballistic hot electron transport graphene, American Institute of Physics, Applied Physics Letters 93, 023128, 2008, pp. 1-3.
Garcia, et al.; Transition from Ohmic to ballistic transport in oriented graphite: Measurements and numerical simulations, The American Physical Society, Physical Review B 78, 035413. 2008, pp. 1-9.
Katsunori Wakabayashi, et al.; Electron transport in graphene, Journal of the Physical Society of Japan, vol. 63, No. 5, 2008, pp. 344-352.

* cited by examiner

*Primary Examiner* — Roy Potter
(74) *Attorney, Agent, or Firm* — Turocy & Watson, LLP

(57) ABSTRACT

A semiconductor device according to one embodiment includes: a semiconductor substrate; an insulating film provided on the semiconductor substrate and containing a wiring trench; a first catalyst layer provided directly or via another member on side and bottom surfaces of the wiring trench; and a first graphene layer provided in the wiring trench so as to be along the side and bottom surface of the wiring trench, the first graphene layer being provided on the first catalyst layer so as to be in contact with the first catalyst layer.

17 Claims, 27 Drawing Sheets

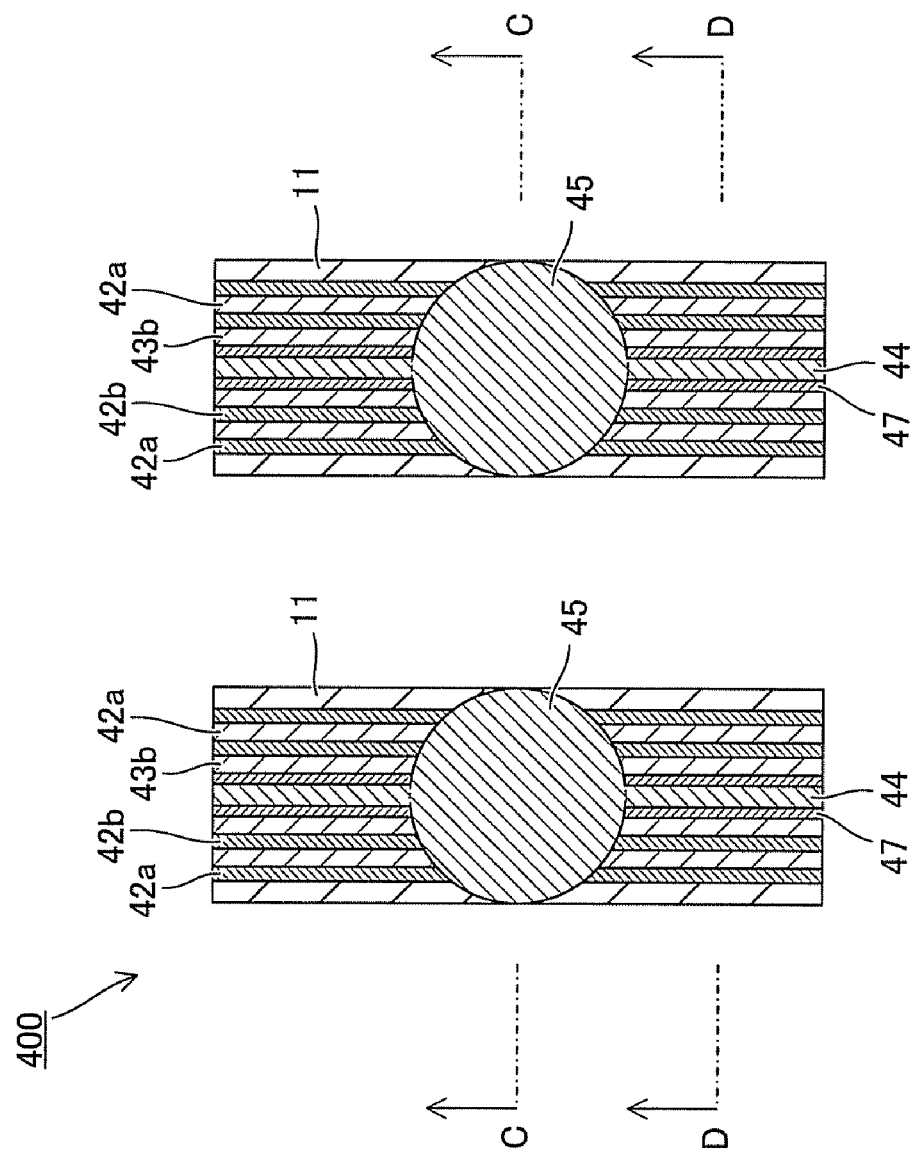

SEMICONDUCTOR DEVICE

CROSS-REFERENCE TO RELATED APPLICATIONS

This application is based upon and claims the benefit of priority from prior Japanese Patent Application No. 2009-164993, filed on Jul. 13, 2009, the entire contents of which are incorporated herein by reference.

BACKGROUND

A conventional wiring containing carbon nanotube is known. This wiring, for example, is disclosed in JP-A 2006-148063. A problem which is, for example, generation of migration phenomenon such as electromigration or stress migration, which occurs in the conventional wiring accompanying miniaturization of the wiring, can be avoided by using carbon nanotube as a wiring material.

However, although a length direction of the carbon nanotube preferably coincides with an electric current direction in order to decrease electric resistance of the wiring, it is difficult to align plural carbon nanotubes so that the length direction thereof faces the length direction of the wiring. In particular, since it is difficult to bend carbon nanotube, decreasing the electric resistance of the wiring is difficult when a pattern of the wiring includes a bent portion.

On the other hand, an electron transport property inside graphene, which is one of carbon allotropes, has been reported. It is disclosed in, for example, non-patent literary documents of "Katsunori Wakabayashi and Koichi Kusabe, Journal of the Physical Society of Japan, Vol. 63, No. 5, 2008, p. 344", "Wang-Kong Tse et al., APPLIED PHYSICS LETTERS 93, 023128, 2008", and "N Garcia et al., PHYSICAL REVIEW B 78, 035413, 2008". A phenomenon in which electron moves without being scattered, which is called ballistic conduction, occurs in graphene.

BRIEF SUMMARY

A semiconductor device according to one embodiment includes: a semiconductor substrate; an insulating film provided on the semiconductor substrate and containing a wiring trench; a first catalyst layer provided directly or via another member on side and bottom surfaces of the wiring trench; and a first graphene layer provided in the wiring trench so as to be along the side and bottom surface of the wiring trench, the first graphene layer being provided on the first catalyst layer so as to be in contact with the first catalyst layer.

A semiconductor device according to another embodiment includes: a wiring comprising a first catalyst layer, a first graphene layer formed on the first catalyst layer, a second catalyst layer formed on the first graphene layer, and a second graphene layer formed on the second catalyst layer, the first catalyst layer comprising a first catalyst material, the first graphene layer comprising a graphene grown using the first catalyst material as a catalyst, the second catalyst layer comprising a second catalyst material, and the second graphene layer comprising a graphene grown using the second catalyst material as a catalyst.

A semiconductor device according to another embodiment includes: a wiring comprising a catalyst layer comprising a catalyst material and a graphene layer formed on an upper surface and a side surface of the catalyst layer, the graphene layer comprising a graphene grown using the catalyst material as a catalyst.

BRIEF DESCRIPTION OF THE DRAWING

FIG. 12 is a top view of the semiconductor device according to the fourth embodiment;

DETAILED DESCRIPTION

First Embodiment

Figure 1:
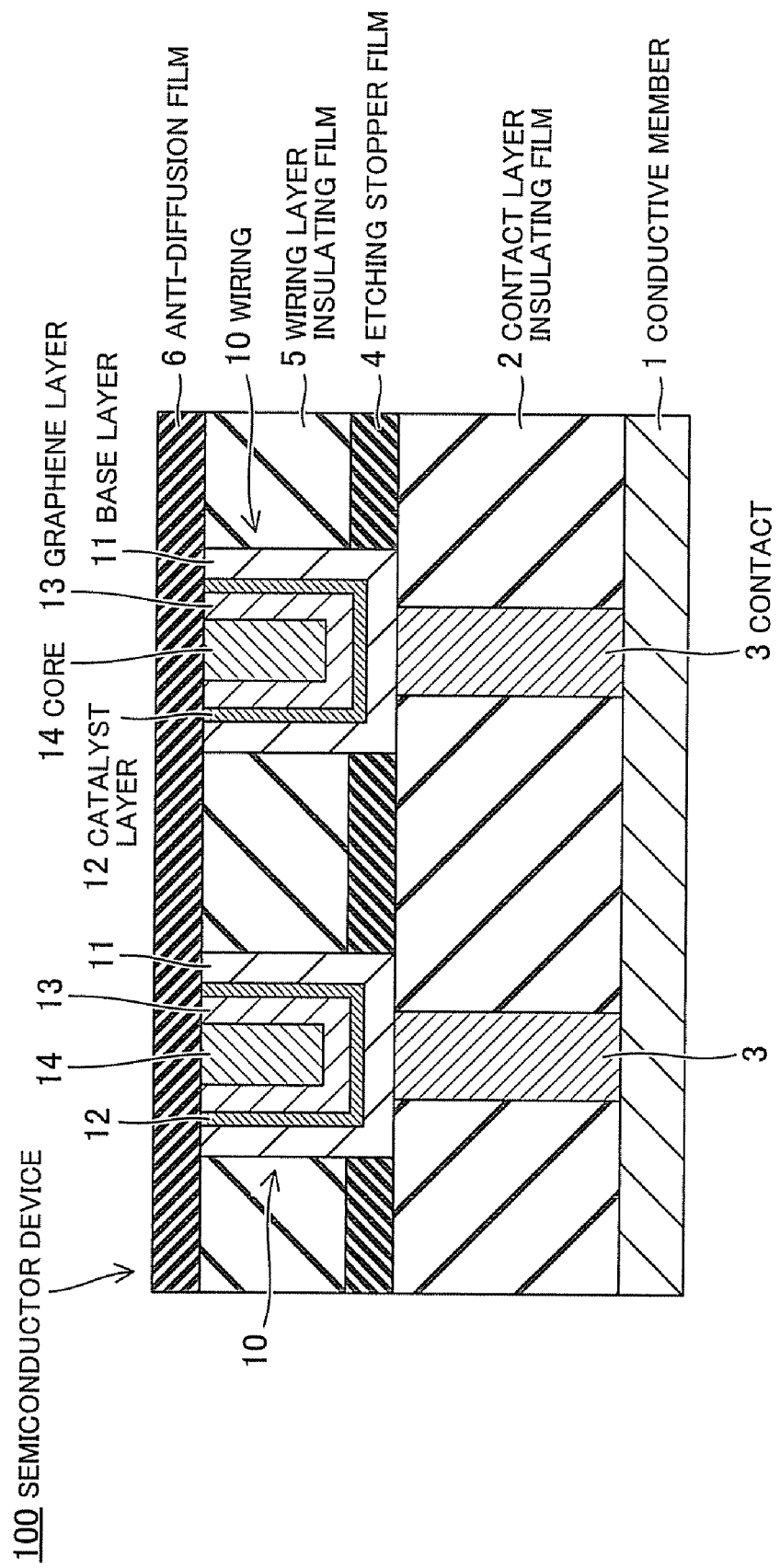
FIG. 1 is a cross sectional view of a semiconductor device according to a first embodiment.

FIG. 1 is a cross sectional view of a semiconductor device 100 according to a first embodiment. The semiconductor device 100 has a wiring 10 formed in an etching stopper film 4 and a wiring layer insulating film 5 and having a single damascene structure, a contact 3 formed in a contact layer insulating film 2 for electrically connecting the wiring 10 as an upper layer and a conductive member 1 as a lower layer, and an anti-diffusion film 6 formed on the wiring 10 and the wiring layer insulating film 5.

The wiring 10 contains a core 14, a graphene layer 13 which is in contact with a bottom surface and both side surfaces of the core 14, a catalyst layer 12 which is in contact with a bottom surface and both side surfaces of the graphene layer 13, and a base layer 11 which is in contact with a bottom surface and both side surfaces of the catalyst layer 12.

The base layer 11 has a function of preventing diffusion of elements contained in the catalyst layer 12 into a peripheral insulating film such as the wiring layer insulating film 5. In addition, the base layer 11 preferably has a function as a co-catalyst for growing graphene which composes the graphene layer 13.

The base layer 11 is made of conductive material which is, e.g., metal such as TaN, TiN, RuN, WN, Ta, Ti, Ru or W, or an oxidation product of these metals. Alternatively, the base layer 11 may have a laminated structure in which plural different conductive materials are laminated. A laminated structure in which, for example, a TaN film and a TiN film are laminated, is effective to promote uniform growth of graphene composing the graphene layer 13.

Note that, since it is possible to form the graphene layer 13 even if the base layer 11 is not formed, the formation of the base layer 11 may be omitted. When the base layer 11 is not formed, the catalyst layer 12 is preferably formed thicker than when the base layer 11 is formed.

The catalyst layer 12 is made of catalyst material which functions as a catalyst for growing graphene composing the graphene layer 13. As a catalyst material, it is possible to use a single metal such as Co, Ni, Fe or Ru, or, an alloy or carbide etc., containing these metals. In addition, the catalyst layer 12 is preferably a continuous film without break for forming uniform graphene, and preferably has a thickness of 0.5 nm or more.

The graphene layer 13 is composed of one to several tens of layers of graphene which is grown using the catalyst layer 12 as a catalyst, and has ballistic conduction properties. Here, the graphene is a single layer film of graphite. Since the graphene layer 13 is continuously formed in a length direction of the wiring 10, an electron transfer pathway is formed in a length direction of the wiring.

It is known that a mean free path of electron in the graphene is about 100 nm-1 μm, and it is further longer than a mean free path of electron in Cu (which is about 40 nm) which is a low resistance metal material currently used for various LSI devices. The graphene has quantum conduction properties and is more advantageous for long-distance electric conduction. In a conventional metal wiring, influence of electron scattering effect at an interface between a wiring and an insulating film becomes remarkable as miniaturization of the wiring proceeds, and thus a resistance increase due to interface electron scattering is not avoidable. In contrast, in the graphene, the resistance increase caused by interface scattering is less due to the quantum conduction. Therefore, it is possible to lower the resistance of the wiring by using a graphene layer for a wiring material.

The core 14 is made of, e.g., metal such as Cu, Al or W used as a typical material, or the same material as the catalyst layer 12. When the core 14 is made of metal, a barrier metal may be formed on a surface of the core 14 in order to prevent diffusion of the metal contained in the core 14 to outside. Note that, the core 14 does not need to have conductivity since the current basically flows in the graphene layer 13, however, a connection of a via, etc., to an upper surface of the wiring 10 is easier when the core 14 has the conductivity.

Figure 2:
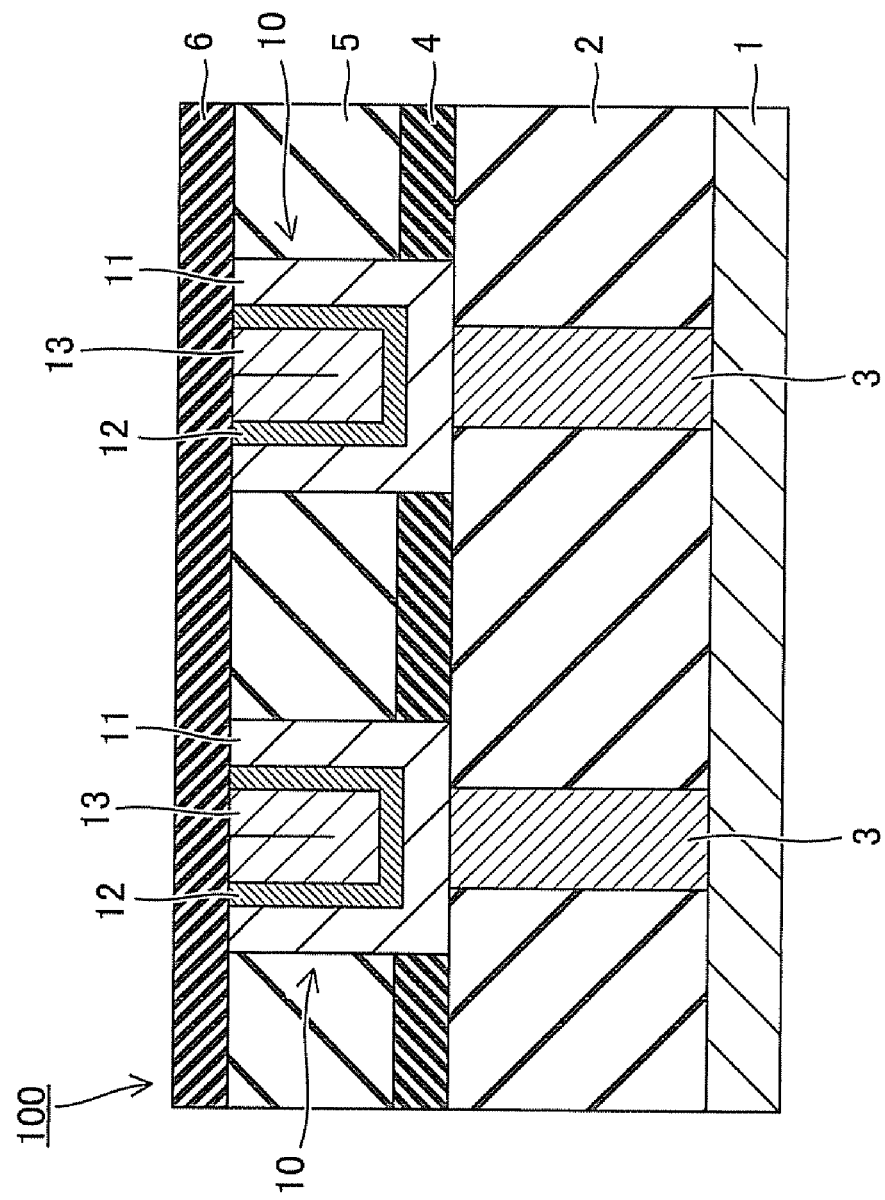
FIG. 2 is a cross sectional view of a semiconductor device according to a modification of the first embodiment.

Alternatively, as shown in FIG. 2, when a void in the wiring 10 is filled only by the base layer 11, the catalyst layer 12 and the graphene layer 13 or when the void can exist in the wiring 10, the core 14 may not be formed.

The conductive member 1 is, e.g., a semiconductor substrate having a semiconductor element such as a transistor or a capacitor formed on a transistor, or a conductive member such as wiring.

The contact layer insulating film 2 is made of insulating film such as TEOS.

The contact 3 is made of, e.g., metal such as W, Cu or Al. Alternatively, a barrier metal may be formed on a surface of the contact 3 in order to prevent diffusion of the metal contained in the contact 3 to outside. In addition, the barrier metal is made of metal such as Ta, Ti, Ru, Mn, Co, or nitride, etc., containing these metals.

The etching stopper film 4 functions as an etching stopper at the time of forming a wiring trench in the wiring layer insulating film 5. The etching stopper film 4 is made of insulation material such as SiCN which has a high etching selectivity with respect to the wiring layer insulating film 5. Note that, when the etching selectivity between the wiring layer insulating film 5 and the contact layer insulating film 2 is sufficiently high, it is not necessary to form the etching stopper film 4.

The wiring layer insulating film 5 is made of insulating film such as SiOC. Alternatively, an insulating material used for the wiring layer insulating film 5 may be a material including microscopic holes in order for reducing dielectric constant.

The anti-diffusion film 6 is made of insulating material such as SiN, SiCN, SiON or SiC. The anti-diffusion film 6 has a function of preventing diffusion of the metal contained in wiring 10 and oxidation of the wiring 10. In addition, when a contact layer is formed above the wiring 10, the anti-diffusion film 6 functions as an etching stopper film.

Figure 3A:
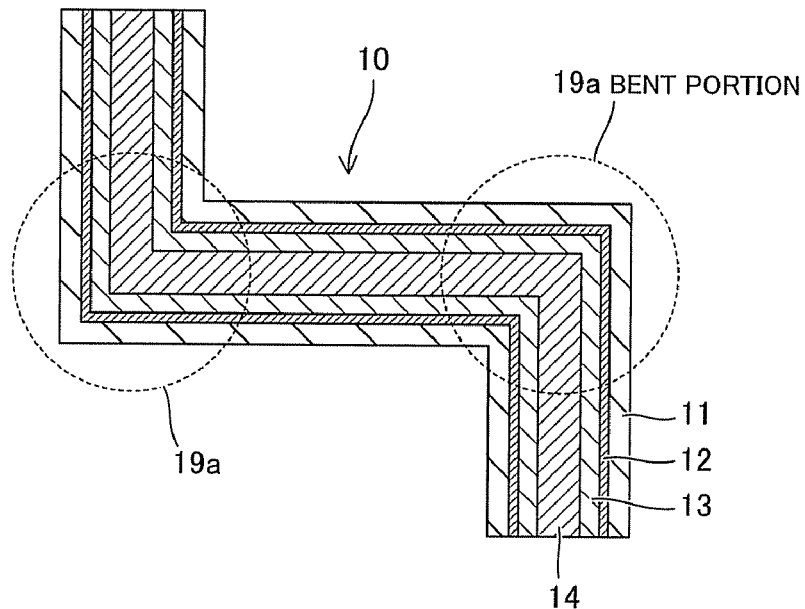
FIGS. 3A and 3B are top views showing an example of a wiring pattern according to the first embodiment.
Figure 3B:
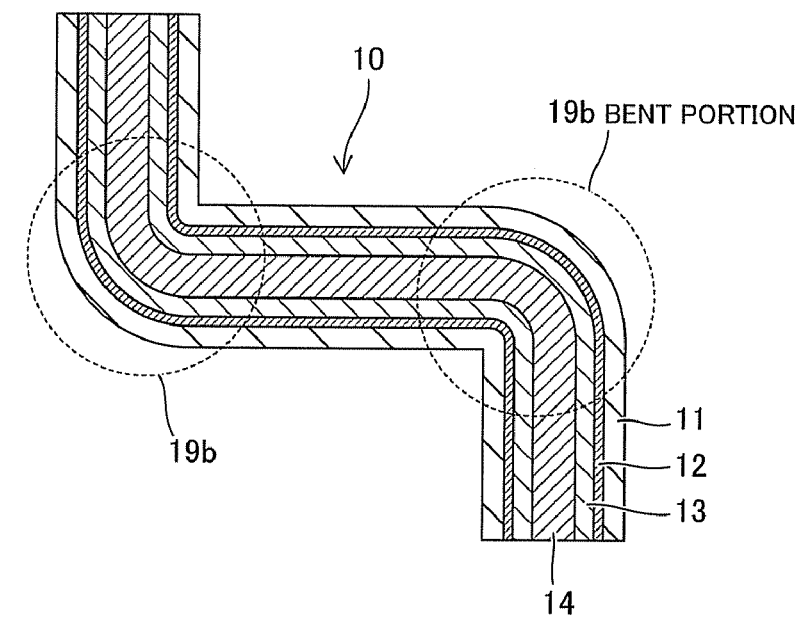

FIGS. 3A and 3B are top views showing an example of a pattern of the wiring 10. FIG. 3A is a top view of the wiring 10 when a pattern thereof contains a bent portion 19a. Unlike the case where the carbon nanotube is used as a wiring material, it is easy to continuously form the graphene layer 13 along the pattern of the wiring 10 even at the bent portion 19a. Thus, it is possible to avoid the problem of increase in the electric resistance at the bent portion 19a.

Meanwhile, FIG. 3B is a top view of the wiring 10 when a pattern thereof contains a round-shaped bent portion 19b. Since the catalyst layer 12 is rounded at the bent portion 19b, the graphene layer 13 can be continuously formed more easily. As a result, the continuous formation of the graphene layer 13 is further facilitated at a bent portion of the wiring pattern.

An example of a method of fabricating the semiconductor device 100 according to the present embodiment will be described hereinafter.

FIGS. 4A to 4F are cross sectional views showing processes for fabricating the semiconductor device 100 according to the first embodiment.

Figure 4A:
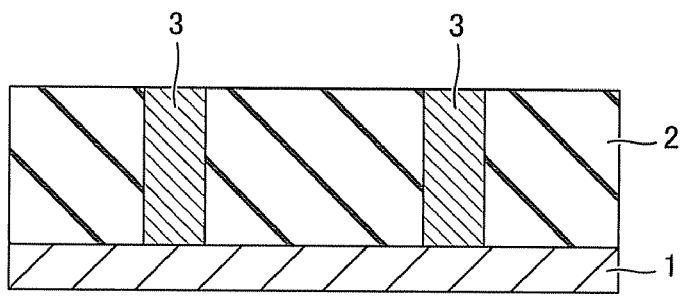
FIGS. 4A to 4F are cross sectional views showing processes for fabricating the semiconductor device according to the first embodiment.

Firstly, as shown in FIG. 4A, the contact layer insulating film 2 including the contact 3 is formed on the conductive member 1.

Figure 4B:
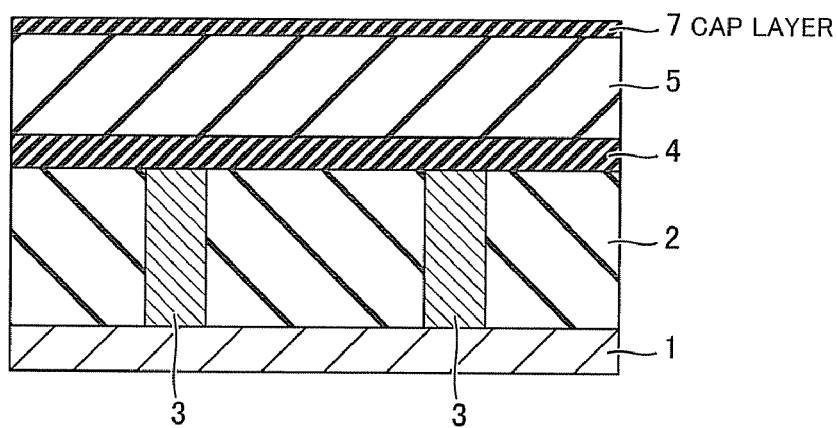

Next, as shown in FIG. 4B, the etching stopper film 4, the wiring layer insulating film 5 and a cap layer 7 are formed on the contact layer insulating film 2 by CVD (Chemical Vapor Deposition) method, etc.

The cap layer 7 has a function of preventing damage to the wiring layer insulating film 5 due to etching or planarization treatment. The cap layer 7 is made of insulation material such as $SiO_2$ or SiOC. Note that, when the wiring layer insulating film 5 is made of a material which is resistant to damage due to the etching, etc., (such as TEOS or SiOC not including microscopic holes), the cap layer 7 may not need to be formed.

Figure 4C:
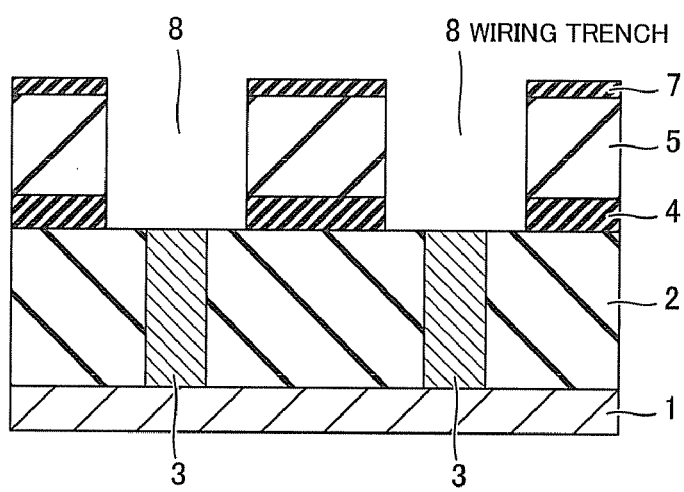

Next, as shown in FIG. 4C, a wiring trench 8 is formed in the cap layer 7, the wiring layer insulating film 5 and the etching stopper film 4 by a combination of, e.g., lithography method and RIE (Reactive Ion Etching) method.

Figure 4D:
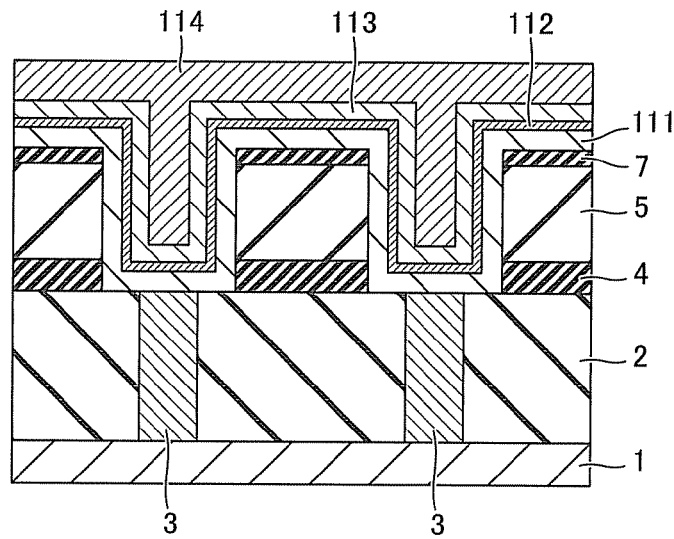

Next, as shown in FIG. 4D, a base film 111 as a material film of the base layer 11, a catalyst film 112 as a material film of the catalyst layer 12, a graphene film 113 as a material film of the graphene layer 13 and a material film 114 as a material film of the core 14 are formed so as to fill the wiring trench 8.

The base film 111 is formed by CVD method or PVD (Physical Vapor Deposition) method. Meanwhile, the catalyst film 112 is formed by CVD method, PVD method or spray method, etc. In addition, the material film 114 is formed by CVD method, PVD method or an electroplating method, etc. When the material film 114 is formed by the electroplating method, it is necessary to preliminarily form a seed layer as a current supply layer made of the same material as the material film 114 by PVD method or CVD method, etc.

A specific example of a method of forming the graphene film 113 will be described below. Firstly, plasma treatment is performed to suppress atomization of the catalyst film 112 due to aggregation thereof. By preventing the atomization of the catalyst film 112 and maintaining continuity of the surface thereof, it is possible to promote uniform growth of graphene. Although hydrogen gas or noble gas is preferable as a discharge gas used for the plasma treatment, a mixture gas containing both of them may be used. The effect is higher at as low treatment temperature as possible, and it is desirable to perform at a room temperature. In addition, it is preferable that the plasma is relatively strong, and the effect is further increased when the catalyst film 112 is exposed to high power remote plasma or plasma.

Next, the catalyst film 112 is carbonized. Hydrocarbon gas such as methane or acetylene, or a mixture gas thereof is used as a discharge gas. Meanwhile, hydrogen gas or noble gas, etc., is used for a carrier gas. It is necessary to perform this treatment at a temperature lower than the treatment temperature during the below-described graphene formation as well as at a temperature at which a graphite film can be formed, and about 150-600° C. is preferable for the treatment temperature during this treatment. In addition, the treatment time of this treatment may be short. This treatment is also preferably performed using relatively strong plasma.

Next, a plasma treatment is performed to improve the quality of a carbonized layer of the catalyst film 112 and to activate the catalyst. It is preferable to use noble gas for a discharge gas. The treatment temperature may be about intermediate between the treatment temperature for carbonizing the catalyst film 112 and that during the below-described graphene formation. The plasma used for this treatment may be relatively weak, and it is preferable to use remote plasma.

At the end, graphene is formed. Hydrocarbon gas or mixture gas containing hydrocarbon is used as a discharge gas. A treatment temperature is about 200-1000° C., and about 350° C. is especially preferable. In case of below 200° C., a sufficient growth rate is not obtained and graphene growth hardly occurs. Under the temperature of 200° C. or more, the graphene growth occurs and a uniform graphene film is formed. This treatment temperature is equivalent to or less than that in a typical wiring formation process of a LSI device, and this graphene formation process is excellent in affinity to a semiconductor process.

In this treatment, since it is important to remove ions as well as electrons and to supply only radical on the catalyst film 112, it is desirable that very weak remote plasma is used. Applying voltage by providing an electrode on an upper portion of a substrate is also effective in order to further remove ions and electrons. The applied voltage is preferably about 0 to ±100V.

The graphene film 113 is obtained by the above-mentioned multistep treatment. It is possible to form the graphene film 113 by the treatment using CVD method under the single condition in which a hydrocarbon gas is used as a carbon source, however, it is possible to form a low resistance graphene film 113 further excellent in uniformity under the low temperature condition by using the multistep treatment as described above.

Figure 4E:
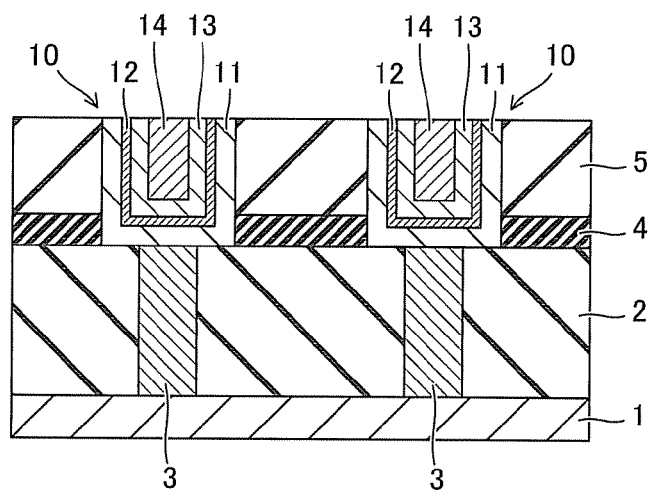

Next, as shown in FIG. 4E, the material film 114, the graphene film 113, the catalyst film 112 and the base film 111 outside the wiring trench 8 are removed by planarization treatment such as CMP (Chemical Mechanical Polishing), thereby forming the core 14, the graphene layer 13, the catalyst layer 12 and the base layer 11. As a result, the wiring 10 is obtained. The cap layer 7 may be left without being removed at this time, however, it is preferable to remove it in order to reduce dielectric constant between the wirings.

Note that, it is preferable that a termination process is performed on the exposed end portion of the graphene layer 13 on the upper surface of the wiring 10 after the planarization treatment. Here, the termination process means treatment for terminating dangling bond not having bondings at an end portion of the graphene, such as hydrogen sintering, silylation treatment or hydrophobizing treatment by HDMS. For example, when the hydrogen sintering is performed, it is possible to terminate the dangling bond by bonding hydrogen thereto, and when the silylation treatment or the hydrophobizing treatment by HDMS is performed, it is possible to terminate the dangling bond by bonding silicon-methyl group, etc., thereto.

When the dangling bond remains without being terminated, electron scattering is likely to occur at an end surface of the graphene and there is a possibility to adversely affect electron conduction properties in the graphene layer. In addition, in a state that the dangling bond remains, unintentional bonding may be formed at a graphene edge, and there is a possibility to adversely affect the electron conduction properties in the graphene in this case as well.

Figure 4F:
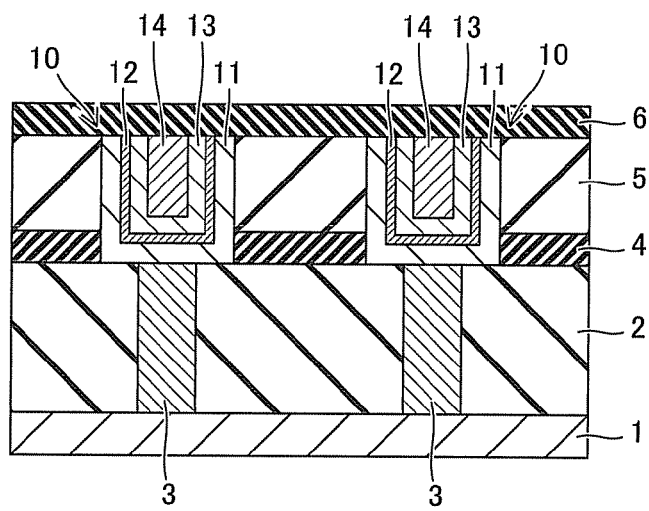

Next, as shown in FIG. 4F, the anti-diffusion film 6 is formed on the wiring 10 and the wiring layer insulating film 5 by CVD method, etc.

(Effect of the First Embodiment)

According to the first embodiment, it is possible to reduce the electric resistance of the wiring 10 using the ballistic conductivity of graphene by forming the graphene layer 13 which is a conductive layer of the wiring 10, and further, it is possible to improve the resistance against migration such as electromigration or stress migration.

In addition, even when the wiring 10 has a pattern including a bent portion (the bent portion 19a or 19b, etc.), it is relatively easy to continuously form the graphene layer 13 at the bent portion, and it is thereby possible to suppress the increase in the electric resistance at the bent portion.

Second Embodiment

The second embodiment is different from the first embodiment in that a contact is directly in contact with a graphene layer. Note that, the explanations will be omitted or simplified for the points same as the first embodiment.

Figure 5A:
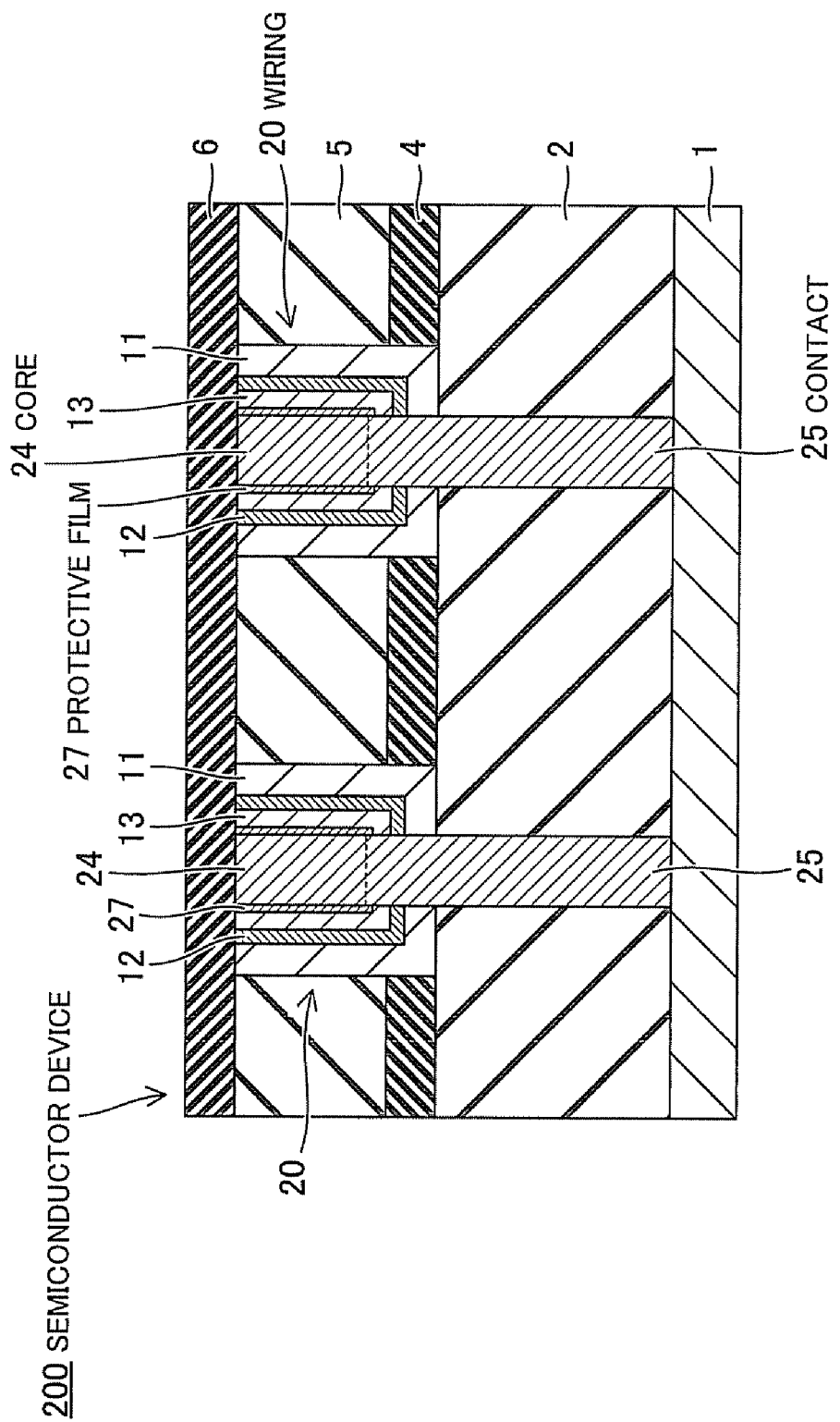
FIGS. 5A and 5B are cross sectional views of a semiconductor device according to a second embodiment.
Figure 5B:
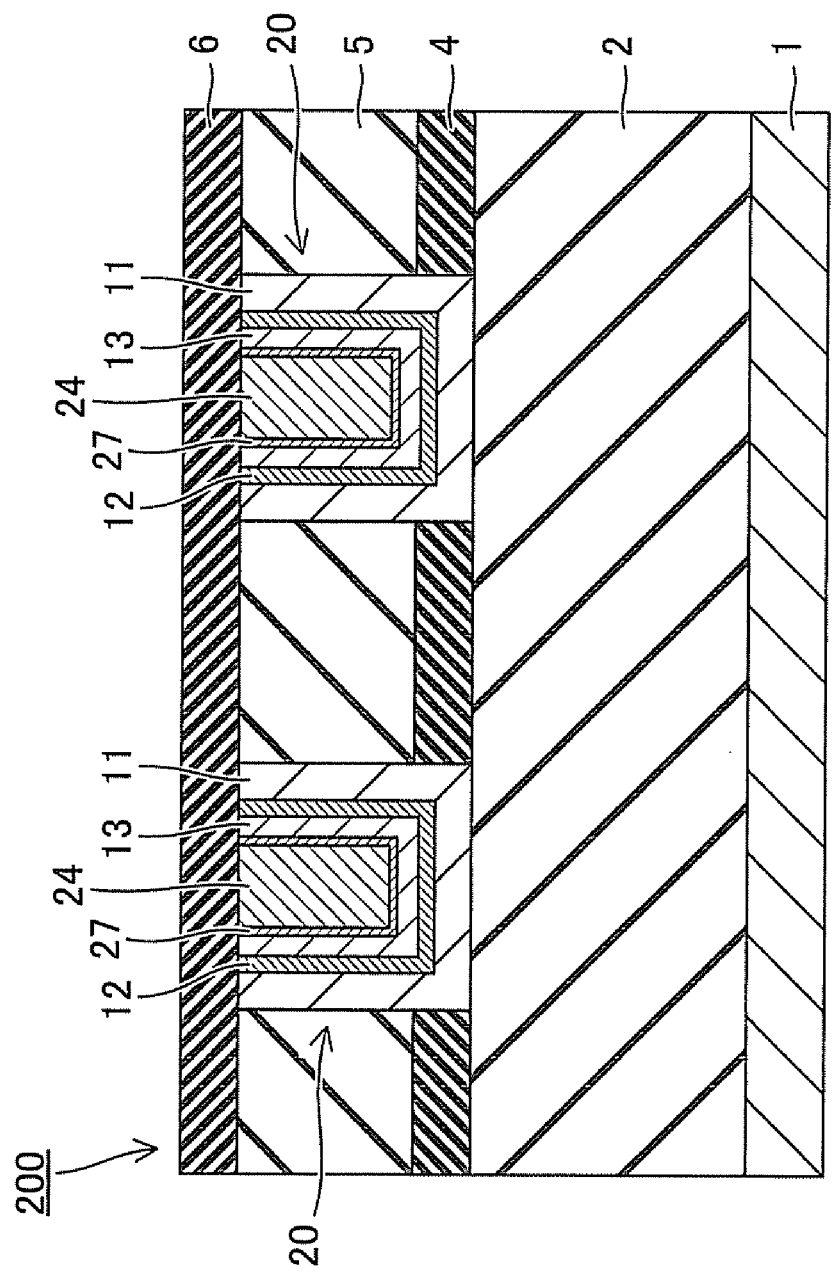
Figure 6:
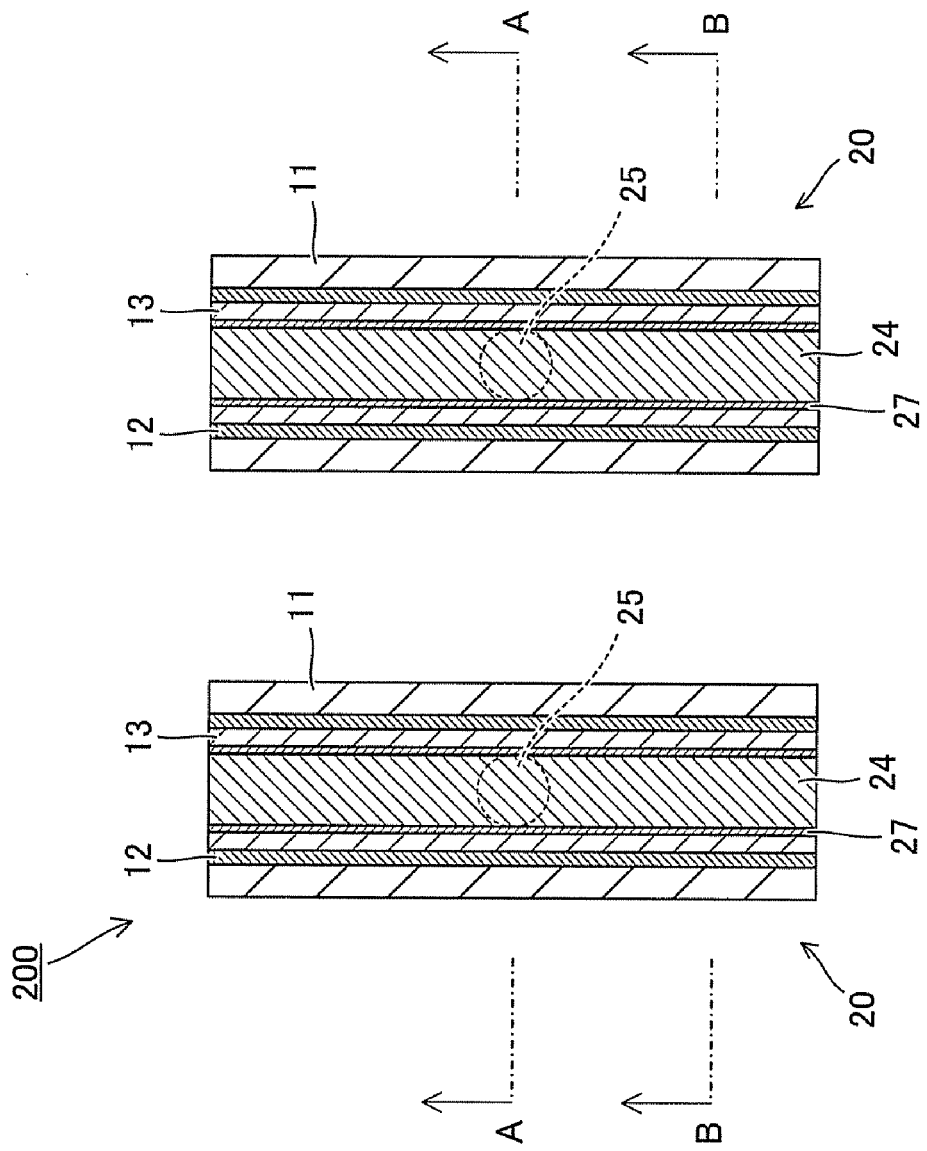
FIG. 6 is a top view of the semiconductor device according to the second embodiment.

FIGS. 5A and 5B are cross sectional views of a semiconductor device 200 according to a second embodiment. In addition, FIG. 6 is a top view of the semiconductor device 200. The cross sectional view taken on line A-A of FIG. 6 corresponds to FIG. 5A and the cross sectional view taken on line B-B corresponds to FIG. 5B. Note that, illustration of the wiring layer insulating film 5 and the anti-diffusion film 6 is omitted in FIG. 6.

The semiconductor device 200 has a wiring 20 formed in an etching stopper film 4 and a wiring layer insulating film 5 and having a damascene structure, a contact 25 formed in a contact layer insulating film 2 for electrically connecting the wiring 20 as an upper layer and a conductive member 1 as a lower layer, and an anti-diffusion film 6 formed on the wiring 20 and the wiring layer insulating film 5.

The wiring 20 contains a core 24, a protective film 27 which is in contact with a bottom surface and both side surfaces of the core 24, a graphene layer 13 which is in contact with a bottom surface and both side surfaces of the protective film 27, a catalyst layer 12 which is in contact with a bottom surface and both side surfaces of the graphene layer 13, and a base layer 11 which is in contact with a bottom surface and both side surfaces of the catalyst layer 12.

The protective film 27 is a film for protecting the graphene layer 13 in a process for forming the below-described contact hole 26. In general, an organic film is often used as a base film of a photoresist film which is used for photolithography method, and when the base film is directly formed on the graphene in the process for forming a contact hole 26 by photolithography method, there is a possibility that the graphene is also removed when the base film is removed by oxygen ashing, etc. Thus, the base film is formed on the graphene layer 13 via the protective film 27 in order to protect the graphene layer 13 at the time of removing the base film.

The protective film 27 is made of, e.g., metal such as Ta, Ti or Co, or nitride or oxide thereof. Note that, when it is not necessary to protect the graphene layer 13 in the process for forming the contact hole 26, the protective film 27 may not need to be formed.

The contact 25 is formed so as to penetrate the graphene layer 13 in a perpendicular direction. Thus, the contact 25 in the present embodiment is directly connected to the graphene layer 13 in contrast to the contact 3 in the first embodiment which is connected to graphene layer 13 via the base layer 11 and the catalyst layer 12. The contact 25 can be formed of the same material as the contact 3 in the first embodiment.

As shown in FIG. 5A, the contact 25 and the core 24 are integrally formed of the same material.

An example of a method of fabricating the semiconductor device 200 according to the present embodiment will be described hereinafter.

Figure 7A:
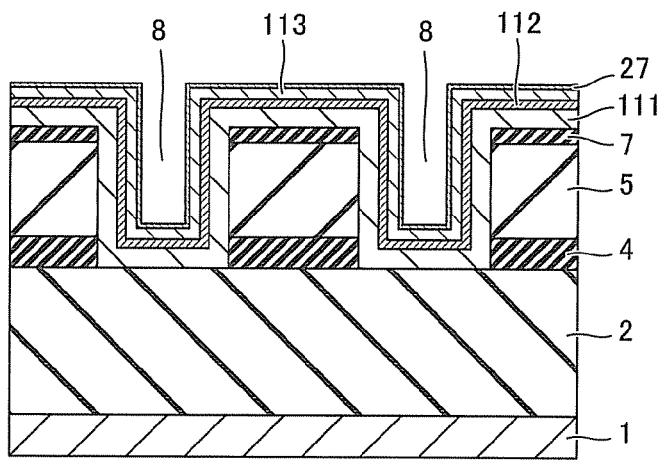
FIGS. 7A to 7C are cross sectional views showing processes for fabricating the semiconductor device according to the second embodiment.
Figure 7B:
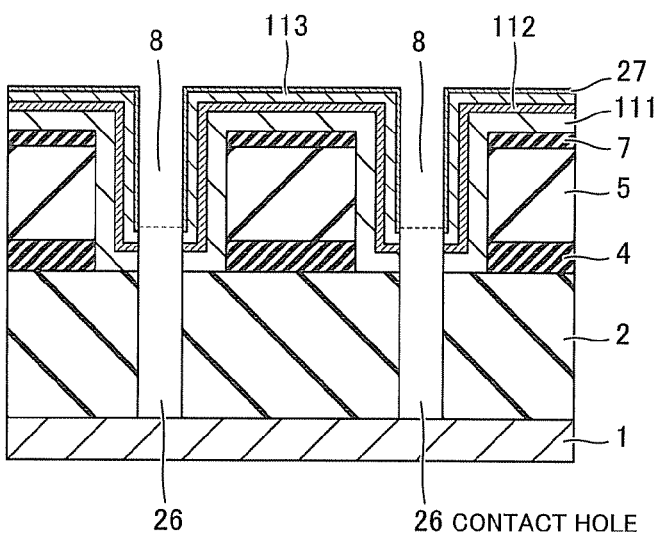
Figure 7C:
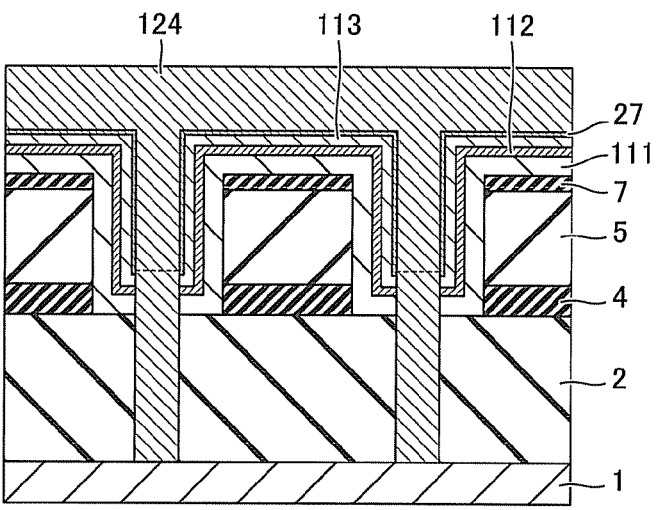

FIGS. 7A to 7C are cross sectional views showing processes for fabricating the semiconductor device 200 according to the second embodiment. The cross sections shown in FIGS. 7A to 7C correspond to the cross section shown in FIG. 5A.

Firstly, the processes until the process for forming the graphene film 113 are carried out in the same way as the first embodiment. However, the contact 3 is not formed.

Next, as shown in FIG. 7A, the protective film 27 is formed by PVD method, etc., so as to cover the surface of the graphene film 113.

Next, as shown in FIG. 7B, a contact hole 26 is formed in the protective film 27, the graphene film 113, the catalyst film 112, the base film 111 and the contact layer insulating film 2 by a combination of, e.g., photolithography method and RIE method.

Next, as shown in FIG. 7C, a material film 124 which is a material film of the contact 25 and the core 24 is formed by CVD method, etc., so as to fill the contact hole 26 and the wiring trench 8.

After that, the material film 124, the protective film 27, the graphene film 113, the catalyst film 112 and the base film 111 outside the wiring trench 8 are removed by planarization treatment, which results in that the wiring 20 is formed, and then, the anti-diffusion film 6 is formed on the wiring 20 and the wiring layer insulating film 5. As a result, the semiconductor device 200 shown in FIGS. 5A, 5B and 6 is obtained.

Note that, the wiring may be formed after the contact is preformed in the same process as the first embodiment. The fabrication processes of the semiconductor device 200 in this case are described below by referring to FIGS. 8A to 8C.

Firstly, the processes until the process for forming the graphene film 113 are carried out in the same way as the first embodiment. The contact 3 is also formed in the same process as the first embodiment.

Figure 8A:
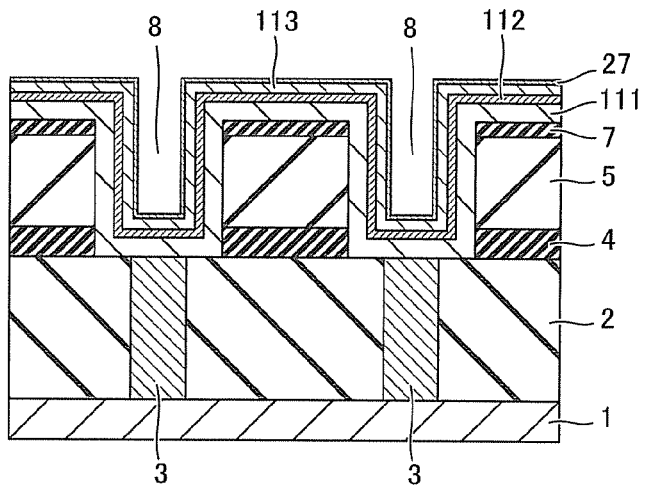
FIGS. 8A to 8C are cross sectional views showing processes for fabricating a semiconductor device according to a modification of the second embodiment.

Next, as shown in FIG. 8A, the protective film 27 is formed by PVD method, etc., so as to cover the surface of the graphene film 113.

Figure 8B:
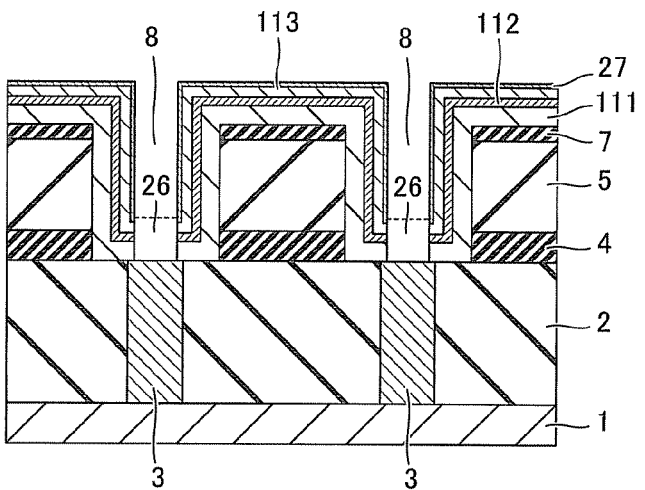

Next, as shown in FIG. 8B, the contact hole 26 is formed in the protective film 27, the graphene film 113, the catalyst film 112 and the base film 111 by a combination of, e.g., photolithography method and RIE method. The upper surface of the contact 3 is exposed on the bottom of the contact hole 26.

Figure 8C:
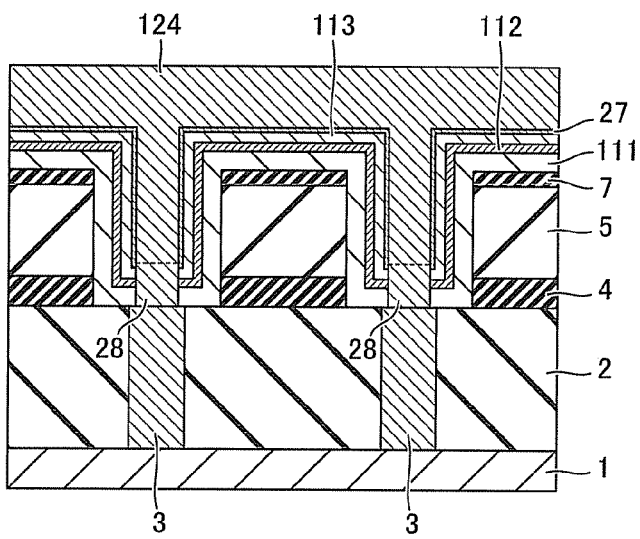

Next, as shown in FIG. 8C, a material film 124, which is a material film of the core 24 and a contact 28 formed in the contact hole 26, is formed by CVD method, etc., so as to fill the contact hole 26 and the wiring trench 8. Here, the material of the material film 124 may be different from the material of the contact 3.

After that, the material film 124, the protective film 27, the graphene film 113, the catalyst film 112 and the base film 111 outside the wiring trench 8 are removed by planarization treatment, which results in that the wiring 20 is formed, and then, the anti-diffusion film 6 is formed on the wiring 20 and the wiring layer insulating film 5. Note that, in this case, the contact of the semiconductor device 200 has a two-stage structure composed of the contact 3 and the contact 28.

(Effect of the Second Embodiment)

According to the second embodiment, since the contact 25 is directly connected to the graphene layer 13, the electric resistance between the contact 25 and the graphene layer 13 can be smaller than that between the contact 3 and the graphene layer 13 in the first embodiment.

Third Embodiment

The third embodiment is different from the first embodiment in that a graphene layer is also formed on an upper surface of a core. Note that, the explanations will be omitted or simplified for the points same as the first embodiment.

Figure 9:
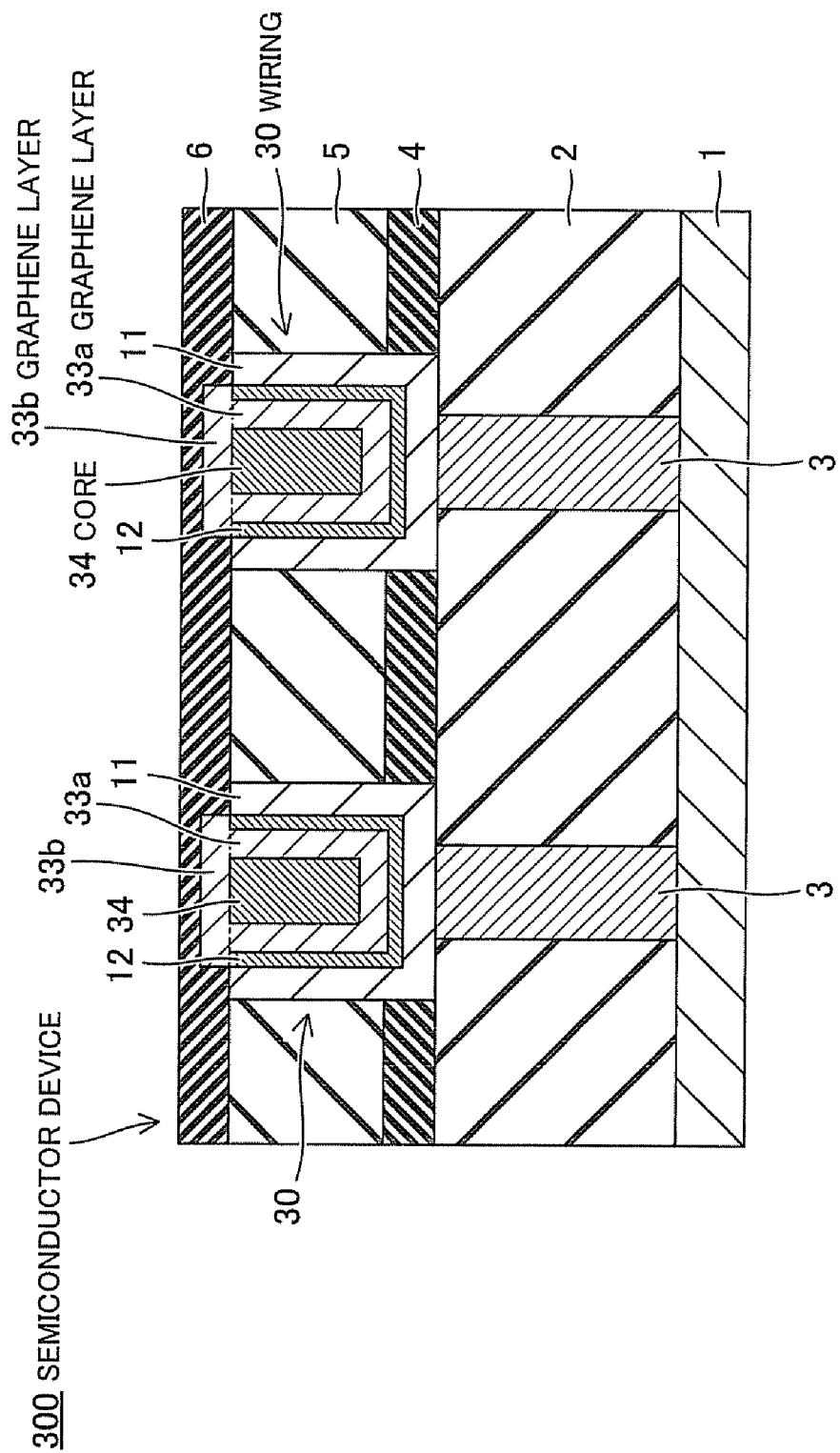
FIG. 9 is a cross sectional view of a semiconductor device according to a third embodiment.

FIG. 9 is a cross sectional view of a semiconductor device 300 according to a third embodiment.

The semiconductor device 300 has a wiring 30 formed in an etching stopper film 4 and a wiring layer insulating film 5 and having a single damascene structure, a contact 3 formed in a contact layer insulating film 2 for electrically connecting the wiring 30 as an upper layer and a conductive member 1 as a lower layer, and an anti-diffusion film 6 formed on the wiring 30 and the wiring layer insulating film 5.

The wiring 30 contains a core 34, a graphene layer 33a which is in contact with a bottom surface and both side surfaces of the core 34, a graphene layer 33b which is in contact with an upper surface of the core 34, a catalyst layer 12 which is in contact with a bottom surface and both side surfaces of the graphene layer 33a, and a base layer 11 which is in contact with a bottom surface and both side surfaces of the catalyst layer 12. The base layer 11 and the catalyst layer 12 are the same as those in the first embodiment.

Similarly to the catalyst layer 12, the core 34 is made of catalyst material which functions as catalyst for growing graphene. In this regard, the material of the core 34 may be the same as or different from that of the catalyst layer 12.

The graphene layers 33a and 33b are composed of one to several tens of layers of graphene which is grown using the catalyst layer 12 and the core 34 as a catalyst. In detail, the graphene layer 33a is made of a graphene which is grown using the catalyst layer 12 as a catalyst and the graphene layer 33b is made of a graphene which is grown using the core 34 and the catalyst layer 12 as a catalyst. The graphene layer 33b is in contact with an end portion of the graphene layer 33a, and the graphene layer 33a is thus electrically connected to the graphene layer 33b.

An example of a method of fabricating the semiconductor device 300 according to the present embodiment will be described hereinafter.

Figure 10A:
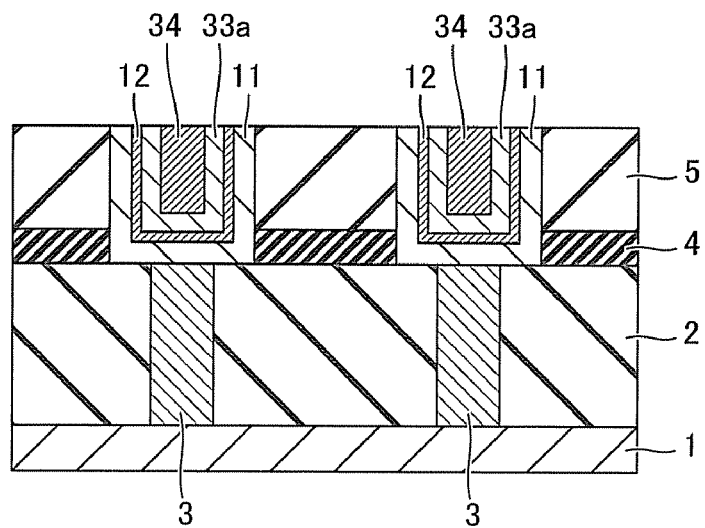
FIGS. 10A and 10B are cross sectional views showing processes for fabricating the semiconductor device according to the third embodiment.
Figure 10B:
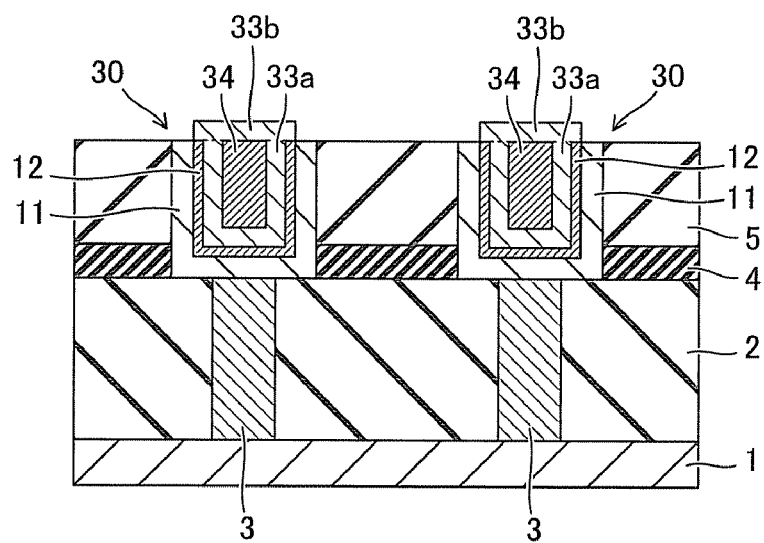

FIGS. 10A and 10B are cross sectional views showing processes for fabricating the semiconductor device 300 according to the third embodiment.

Firstly, as shown in FIG. 10A, the processes until the process, shown in FIGS. 4A to 4E, for forming the wiring 10 are carried out in the same way as the first embodiment. However, the core 34 is formed instead of the core 14 in the first embodiment. The graphene layer 33a corresponds to the graphene layer 13 in the first embodiment.

Next, as shown in FIG. 10B, a graphene is grown from the exposed upper surfaces of the catalyst layer 12 and the core 34, thereby forming the graphene layer 33b. As a result, the wiring 30 is obtained.

Note that, since the graphene layer 33b is formed continuously with the end portion of the graphene layer 33a which is exposed by planarization treatment, a termination process for the graphene layer 33a is not necessary.

After that, the anti-diffusion film 6 is formed on the wiring 30 and the wiring layer insulating film 5. As a result, the semiconductor device 300 shown in FIG. 9 is obtained.

(Effect of the Third Embodiment)

According to the third embodiment, the graphene layer 33b is formed, thereby connecting to the end portion of the graphene layer 33a. Since the graphene layer does not have an end surface and also continues on the upper surface of the wiring 30 without any breaks, there is no electron scattering at the end surface of the graphene. As a result, it is possible to further reduce the wiring resistance.

In addition, when a via, etc., is connected to the upper surface of the wiring 30, it is facilitated to connect the via, etc., directly to the graphene layer by forming the graphene layer 33b.

Note that, the present embodiment may be combined with the second embodiment. In this case, for example, after the wiring 20 is formed by processing the material film 124, the protective film 27, the graphene film 113, the catalyst film 112 and the base film 111 by planarization treatment in the process described in the second embodiment, a graphene is grown using the core 24 and the catalyst layer 12 as a catalyst, thereby forming a graphene layer which corresponds to the graphene layer 33b in the present embodiment. In this case, the core 24 is made of material which functions as catalyst for growing the graphene. In addition, when the protective film 27 is formed of a catalyst material, it is also possible to use the protective film 27 as a catalyst for growing the graphene.

Fourth Embodiment

The fourth embodiment is different from the second embodiment in that multiple graphene layers are formed. Note that, the explanations will be omitted or simplified for the points same as the second embodiment.

Figure 11A:
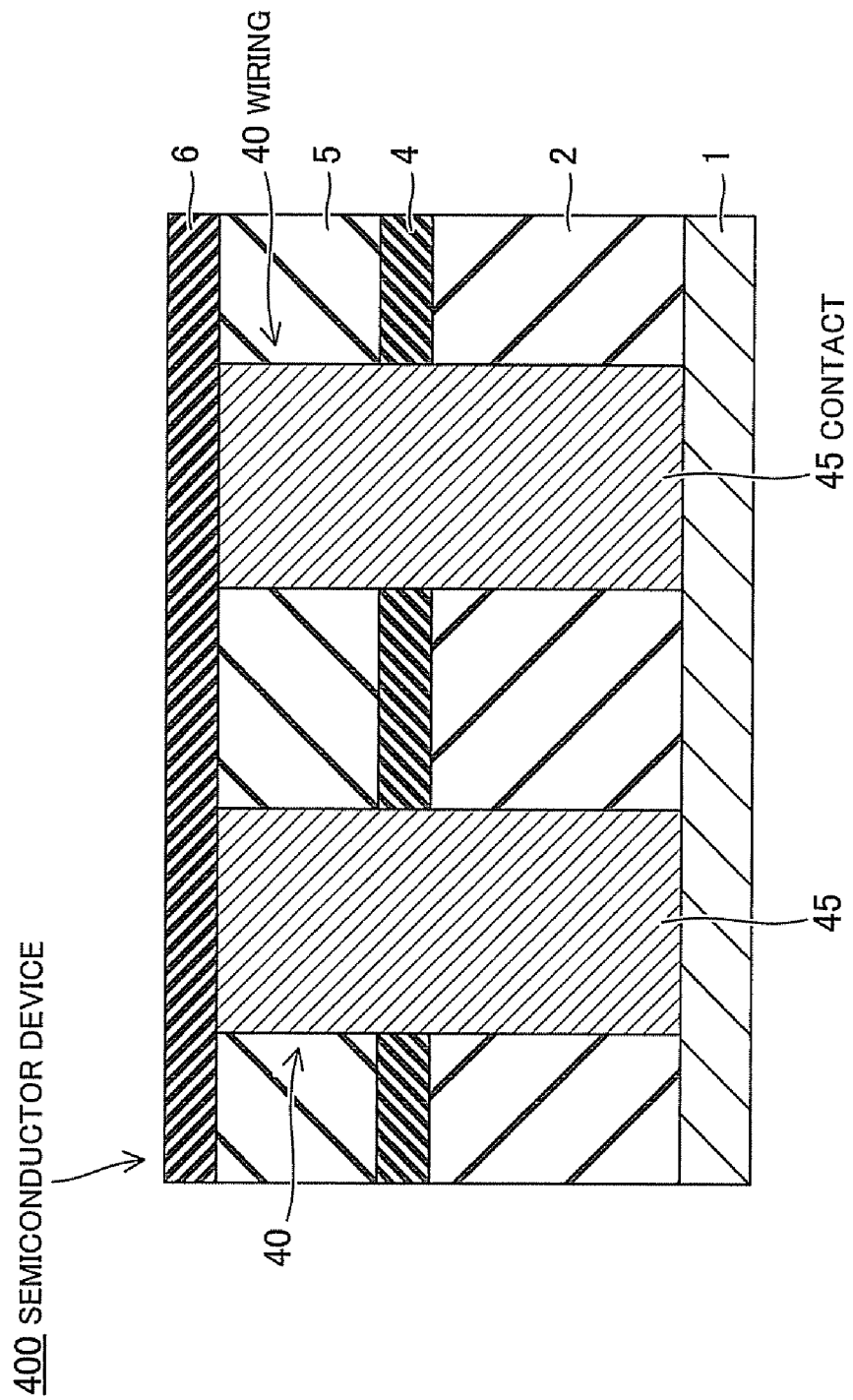
FIGS. 11A and 11B are cross sectional views of a semiconductor device according to a fourth embodiment.
Figure 11B:
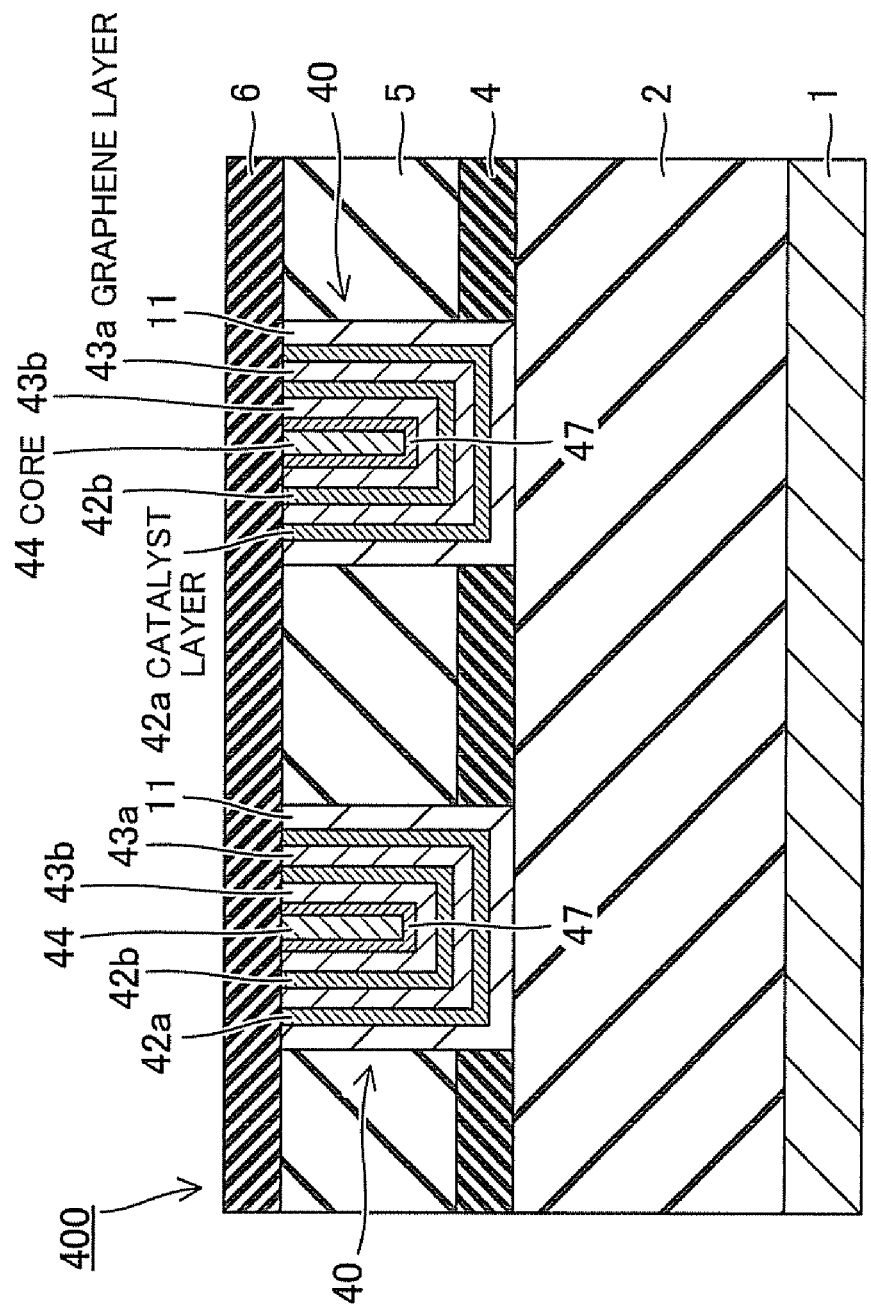

FIGS. 11A and 11B are cross sectional views of a semiconductor device 400 according to a fourth embodiment. In addition, FIG. 12 is a top view of the semiconductor device 400. The cross sectional view taken on line C-C of FIG. 12 corresponds to FIG. 11A and the cross sectional view taken on line D-D of FIG. 12 corresponds to FIG. 11B. Note that, illustration of the wiring layer insulating film 5 and the anti-diffusion film 6 is omitted in FIG. 12.

The semiconductor device 400 has a wiring 40 formed in an etching stopper film 4 and a wiring layer insulating film 5 and having a damascene structure, a contact 45 formed in a contact layer insulating film 2, the etching stopper film 4 and the wiring layer insulating film 5 so as to penetrate or divide the wiring 40 for electrically connecting the wiring 40 as an upper layer and a conductive member 1 as a lower layer, and an anti-diffusion film 6 formed on the wiring 40 and the wiring layer insulating film 5. The diameter of the contact 45 is substantially equal to the width of the wiring 40.

The wiring 40 contains a core 44, a protective film 47 which is in contact with a bottom surface and both side surfaces of the core 44, a graphene layer 43b which is in contact with a bottom surface and both side surfaces of the protective film 47, a catalyst layer 42b which is in contact with a bottom surface and both side surfaces of the graphene layer 43b, a graphene layer 43a which is in contact with a bottom surface and both side surfaces of the catalyst layer 42b, a catalyst layer 42a which is in contact with a bottom surface and both side surfaces of the graphene layer 43a, and a base layer 11 which is in contact with a bottom surface and both side surfaces of the catalyst layer 42a.

The catalyst layers 42a and 42b are made of the same material as the catalyst layer 12 in the first embodiment. In addition, the catalyst layers 42a and 42b are preferably continuous films without break for each forming uniform graphene, and preferably have a thickness of 0.5 nm or more. Meanwhile, the protective film 47 is made of the same material as the protective film 27 in the second embodiment.

The graphene layers 43a and 43b are each composed of one to several tens of layers of graphene which is grown using the catalyst layers 42a and 42b as a catalyst, and have ballistic conduction properties. Since the graphene layers 43a and 43b are continuously formed in a length direction of the wiring 40, an electron transfer pathway is formed in a length direction of the wiring.

The material of the catalyst layer 42a may be the same as or different from that of the catalyst layer 42b.

Alternatively, three or more graphene layers may be formed. A catalyst layer is each formed between the graphene layers in this case as well.

The contact 45 is formed so as to penetrate or divide the graphene layers 43a and 43b in a perpendicular direction. Thus, the contact 45 is directly connected to the graphene layers 43a and 43b. The contact 45 can be made of the same material as the contact 3 in the first embodiment.

As shown in FIG. 12, the contact 45 and the core 44 are integrally formed of the same material.

An example of a method of fabricating the semiconductor device 400 according to the present embodiment will be described hereinafter.

Figure 13A:
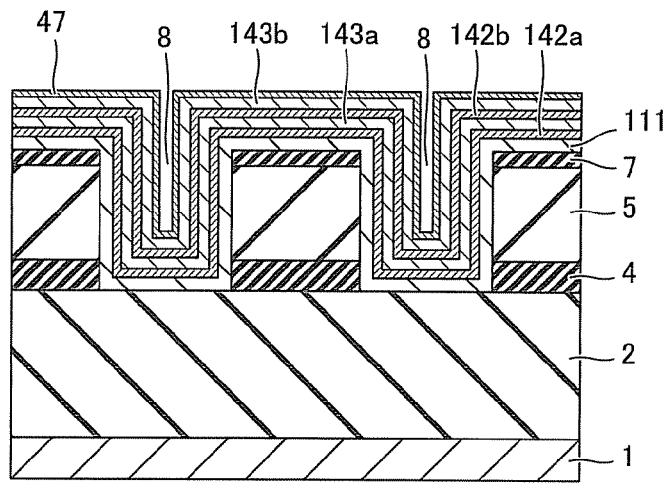
FIGS. 13A to 13C are cross sectional views showing processes for fabricating the semiconductor device according to the fourth embodiment.
Figure 13B:
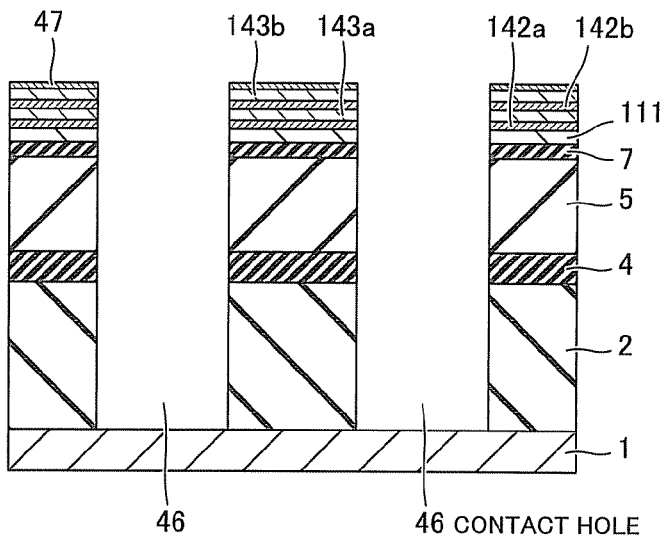
Figure 13C:
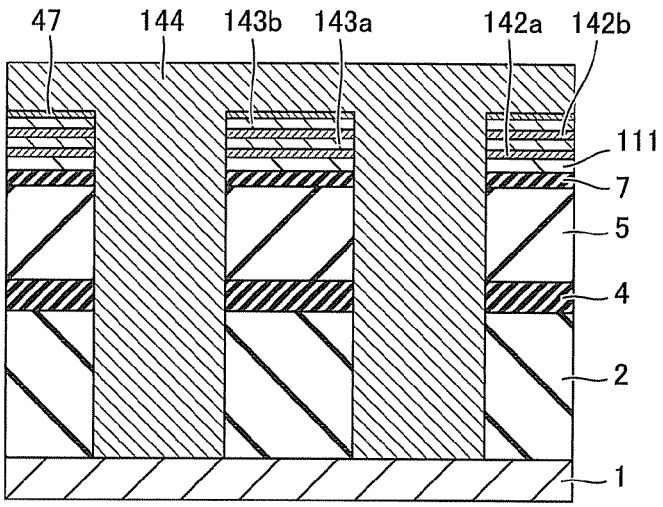

FIGS. 13A to 13C are cross sectional views showing processes for fabricating the semiconductor device 400 according to the fourth embodiment. The cross sections shown in FIGS. 13A to 13C correspond to the cross section shown in FIG. 11A.

Firstly, the processes until the process, shown in FIGS. 4A to 4C, for forming the wiring trench 8 are carried out in the same way as the first embodiment. However, the contact 3 is not formed.

Next, as shown in FIG. 13A, a base film 111 as a material film of the base layer 11, a catalyst film 142a as a material film of the catalyst layer 42a, a graphene film 143a as a material film of the graphene layer 43a, a catalyst film 142b as a material film of the catalyst layer 42b, a graphene film 143b as a material film of the graphene layer 43b, and a protective film 47 are formed along the inner surface of the wiring trench 8.

Next, as shown in FIG. 13B, a contact hole 46 is formed in the wiring layer insulating film 5, the etching stopper film 4 and the contact layer insulating film 2 by a combination of, e.g., photolithography method and RIE method so as to penetrate or divide the protective film 47, the graphene film 143b, the catalyst film 142b, the graphene film 143a, the catalyst film 142a and the base film 111.

Next, as shown in FIG. 13C, a material film 144 which is a material film of the contact 45 and the core 44 is formed by CVD method, etc., so as to fill the contact hole 46 and the wiring trench 8.

After that, the material film 144, the protective film 47, the graphene film 143b, the catalyst film 142b, the graphene film 143a, the catalyst film 142a and the base film 111 outside the contact hole 46 and the wiring trench 8 are removed by planarization treatment, which results in that the wiring 40 is formed, and then, the anti-diffusion film 6 is formed on the wiring 40 and the wiring layer insulating film 5. As a result, the semiconductor device 400 shown in FIGS. 11A, 11B and 12 is obtained.

Note that, when the diameter of the contact 45 can be adjusted to be smaller than the width of the core 44, the semiconductor device 400 may be formed by the same method as the second embodiment.

In addition, the wiring may be formed after the contact is preformed in the contact layer insulating film. The fabrication processes of the semiconductor device 400 in this case are described below by referring to FIGS. 14A to 14C.

Figure 14A:
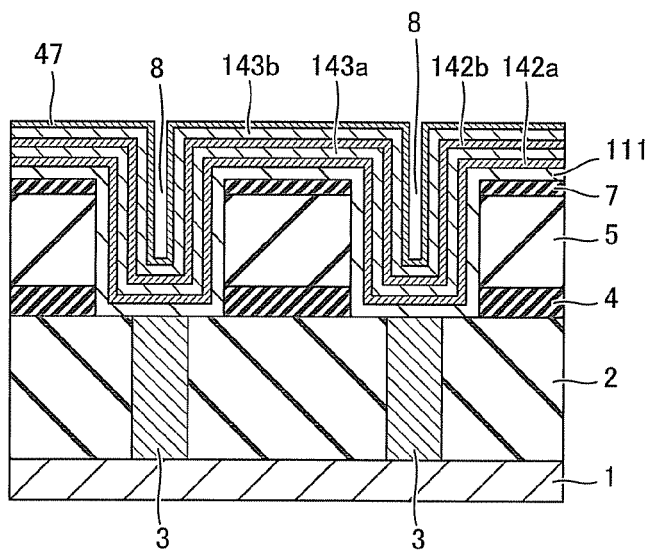
FIGS. 14A to 14C are cross sectional views showing processes for fabricating a semiconductor device according to a modification of the fourth embodiment.

Firstly, as shown in FIG. 14A, the base film 111, the catalyst film 142a, the graphene film 143a, the catalyst layer 142b and the graphene film 143b are formed along the inner surface of the wiring trench 8. Here, the contact 3 is preformed in the contact layer insulating film 2.

Figure 14B:
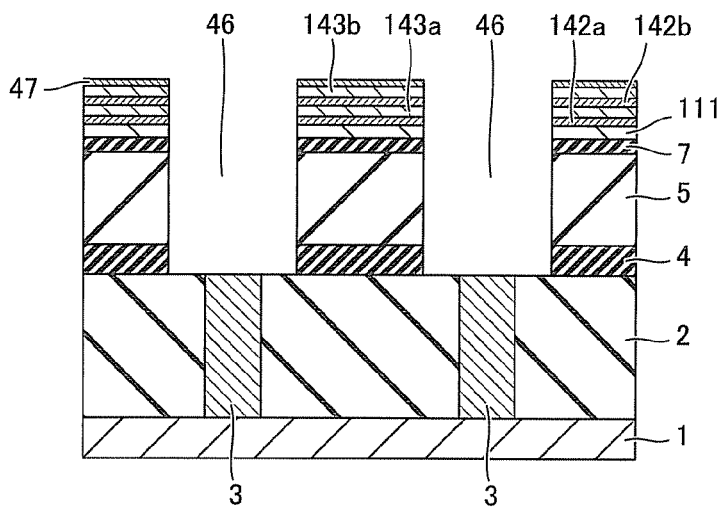

Next, as shown in FIG. 14B, the contact hole 46 is formed in the wiring layer insulating film 5 and the etching stopper film 4 by a combination of, e.g., photolithography method and RIE method so as to penetrate or divide the graphene film 143b, the catalyst film 142b, the graphene film 143a, the catalyst film 142a and the base film 111. Here, the upper surface of the contact 3 is exposed on the bottom of the contact hole 46.

Figure 14C:
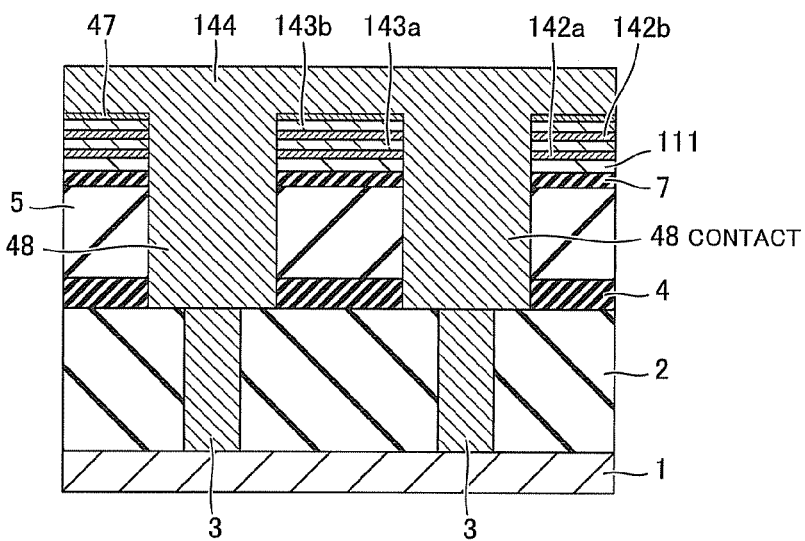

Next, as shown in FIG. 14C, a material film 144, which is a material film of the core 44 and a contact 48 formed in the contact hole 46, is formed by CVD method, etc., so as to fill the contact hole 46 and the wiring trench 8. Here, the material of the material film 144 may be different from the material of the contact 3.

After that, the material film 144, the graphene film 143b, the catalyst film 142b, the graphene film 143a, the catalyst film 142a and the base film 111 outside the contact hole 46 and the wiring trench 8 are removed by a planarization treatment using the cap layer 7 as a stopper, which results in the wiring 40 is formed, and then, the anti-diffusion film 6 is formed on the wiring 40 and the wiring layer insulating film 5. Note that, the contact of the semiconductor device 400 has a two-stage structure composed of the contact 3 and the contact 48 in this case.

(Effect of the Fourth Embodiment)

According to the fourth embodiment, it is possible to reduce the electric resistance of the wiring by forming plural graphene layers which contributes to electron conduction compared with the case of forming only one graphene layer.

Fifth Embodiment

The fifth embodiment is different from the third embodiment in that multiple graphene layers are formed. Note that, the explanations will be omitted or simplified for the points same as the third embodiment.

Figure 15:
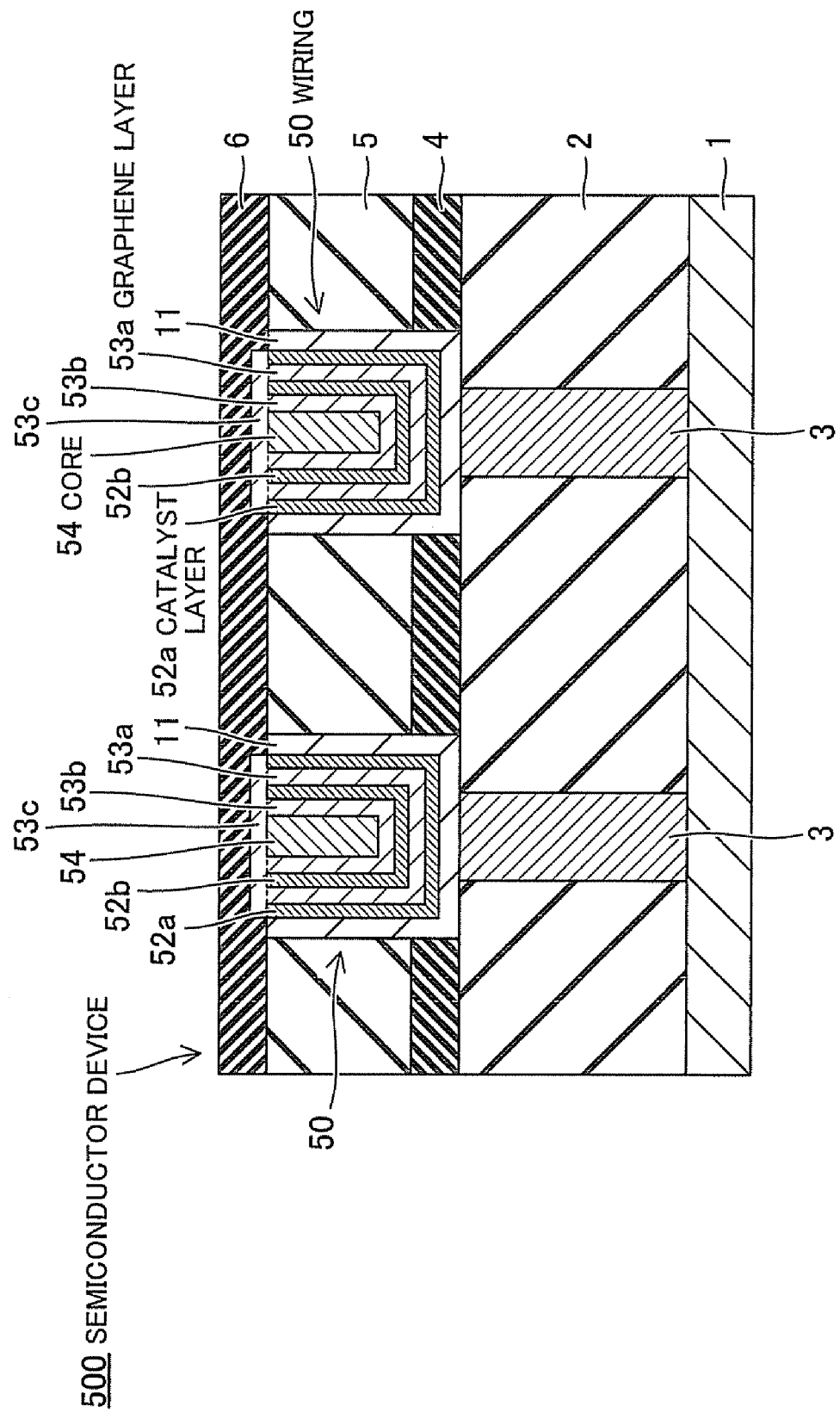
FIG. 15 is a cross sectional view of a semiconductor device according to a fifth embodiment.

FIG. 15 is a cross sectional view of a semiconductor device 500 according to a fifth embodiment.

The semiconductor device 500 has a wiring 50 formed in an etching stopper film 4 and a wiring layer insulating film 5 and having a single damascene structure, a contact 3 formed in a contact layer insulating film 2 for electrically connecting the wiring 50 as an upper layer and a conductive member 1 as a lower layer, and an anti-diffusion film 6 formed on the wiring 50 and the wiring layer insulating film 5.

The wiring 50 contains a core 54, a graphene layer 53b which is in contact with a bottom surface and both side surfaces of the core 54, a catalyst layer 52b which is in contact with a bottom surface and both side surfaces of the graphene layer 53b, a graphene layer 53a which is in contact with a bottom surface and both side surfaces of the catalyst layer 52b, a catalyst layer 52a which is in contact with a bottom surface and both side surfaces of the graphene layer 53a, a graphene layer 53c which is in contact with upper surfaces of the core 54 and the catalyst layers 52a and 52b, and a base layer 11 which is in contact with a bottom surface and both side surfaces of the catalyst layer 52a.

Note that, the graphene layers 53a, 53b and the catalyst layers 52a, 52b are the same as the graphene layers 43a, 43b and the catalyst layers 42a, 42b in the fourth embodiment, respectively.

Similarly to the catalyst layers 52a and 52b, the core 54 is made of catalyst material which functions as catalyst for growing graphene. In this regard, the material of the core 54 may be the same as or different from that of the catalyst layers 52a and 52b. In addition, the material of the catalyst layer 52a may be the same as or different from that of the catalyst layer 52b.

The graphene layers 53a, 53b and 53c are composed of one to several tens of layers of graphene which is grown using the catalyst layers 52a, 52b and the core 54 as a catalyst. In detail, the graphene layer 53a is made of a graphene which is grown using the catalyst layer 52a as a catalyst, the graphene layer 53b is made of a graphene which is grown using the catalyst layer 52b as a catalyst, and the graphene layer 53c is made of a graphene which is grown using the core 54 and the catalyst layers 52a and 52b as a catalyst. The graphene layer 53c is in contact with end portions of the graphene layers 53a and 53b, and the graphene layers 53a, 53b and 53c are thus electrically connected.

An example of a method of fabricating the semiconductor device 500 according to the present embodiment will be described hereinafter.

Figure 16A:
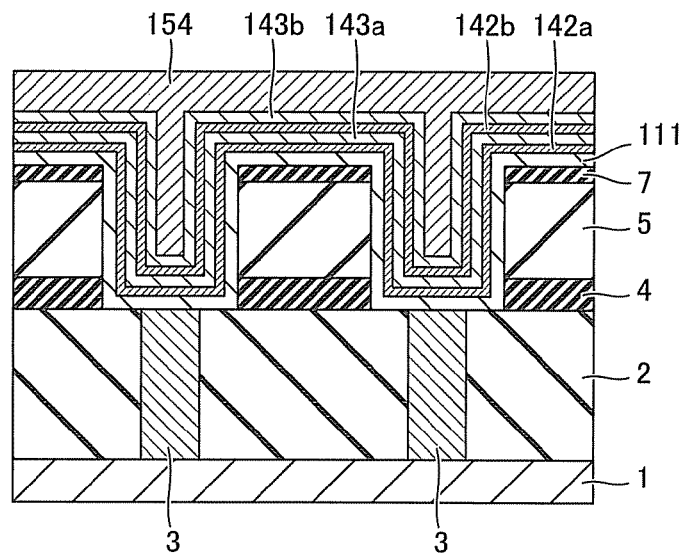
FIGS. 16A to 16C are cross sectional views showing processes for fabricating the semiconductor device according to the fifth embodiment.
Figure 16B:
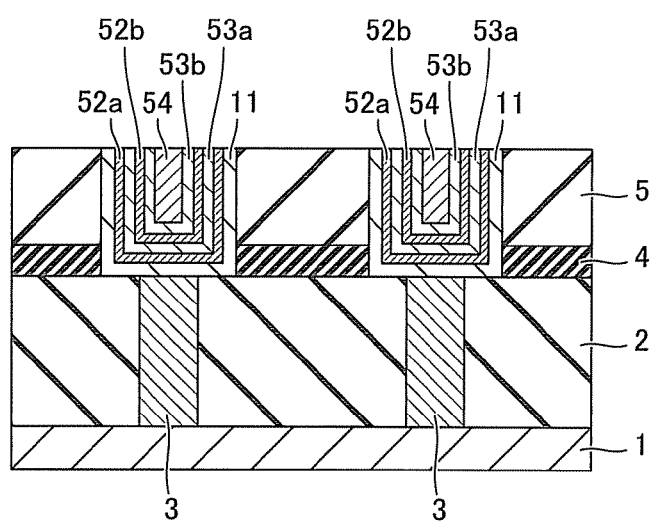
Figure 16C:
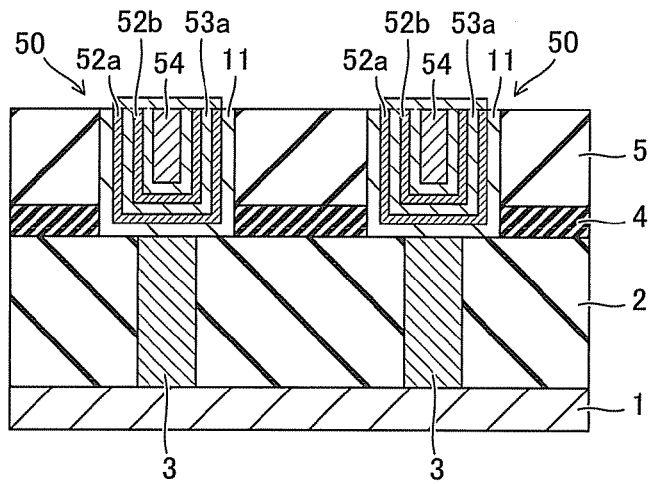

FIGS. 16A to 16C are cross sectional views showing processes for fabricating the semiconductor device 500 according to the fifth embodiment.

Firstly, the processes until the process, shown in FIG. 13A, for forming the graphene layer 143b are carried out in the same way as the fourth embodiment. In this regard, the contact 3 is formed in the contact layer insulating film 2.

Next, as shown in FIG. 16A, a material film 154 which is a material film of the core 54 is formed on the graphene film 143b so as to fill the wiring trench 8.

Next, as shown in FIG. 16B, the material film 154, the graphene film 143b, the catalyst film 142b, the graphene film 143a, the catalyst film 142a and the base film 111 outside the wiring trench 8 are removed by a planarization treatment using the cap layer 7 as a stopper, thereby forming the core 54, the graphene layers 53a, 53b, the catalyst layers 52a, 52b and the base layer 11.

Next, as shown in FIG. 16C, a graphene is grown from the exposed upper surfaces of the catalyst layers 52a, 52b and the core 54, thereby forming the graphene layer 53c. As a result, the wiring 50 is obtained.

After that, the anti-diffusion film 6 is formed on the wiring 50 and the wiring layer insulating film 5. As a result, the semiconductor device 500 shown in FIG. 15 is obtained.
(Effect of the Fifth Embodiment)

According to the fifth embodiment, the number of the graphene layers which contributes to electron conduction is increased by forming the graphene layer 53c, compared with the case of forming only graphene layers 53a and 53b without forming the graphene layer 53c. As a result, it is possible to reduce the wiring resistance.

In addition, the graphene layer 53c is formed, thereby connecting to the end portions of the graphene layers 53a and 53b. Since the graphene layer does not have an end surface and also continues on the upper surface of the wiring 50 without any breaks, there is no electron scattering at the end surface of the graphene. As a result, it is possible to further reduce the wiring resistance.

In addition, when a via, etc., is connected to the upper surface of the wiring 50, it is facilitated to connect the via, etc., directly to the graphene layer by forming the graphene layer 53c.

In addition, since the graphene layers 53a, 53b and 53c are electrically connected without intervention of other material by forming the graphene layer 53c, it is possible to further reduce the wiring resistance.

Note that, the present embodiment may be combined with the fourth embodiment. In this case, for example, after the wiring 40 is formed by processing the material film 144, the graphene film 143b, the catalyst film 142b, the graphene film 143a, the catalyst film 142a and the base film 111 by the planarization treatment in the process shown in the fourth embodiment, a graphene is grown using the core 44 and the catalyst layers 42a and 42b as a catalyst, thereby forming a graphene layer which corresponds to the graphene layer 53c in the present embodiment. In this case, the core 44 is made of material which functions as catalyst for growing the graphene.

Sixth Embodiment

The sixth embodiment is different from the first embodiment in that a graphene layer has a planar shape. Note that, the explanations will be omitted or simplified for the points same as the first embodiment.

Figure 17:
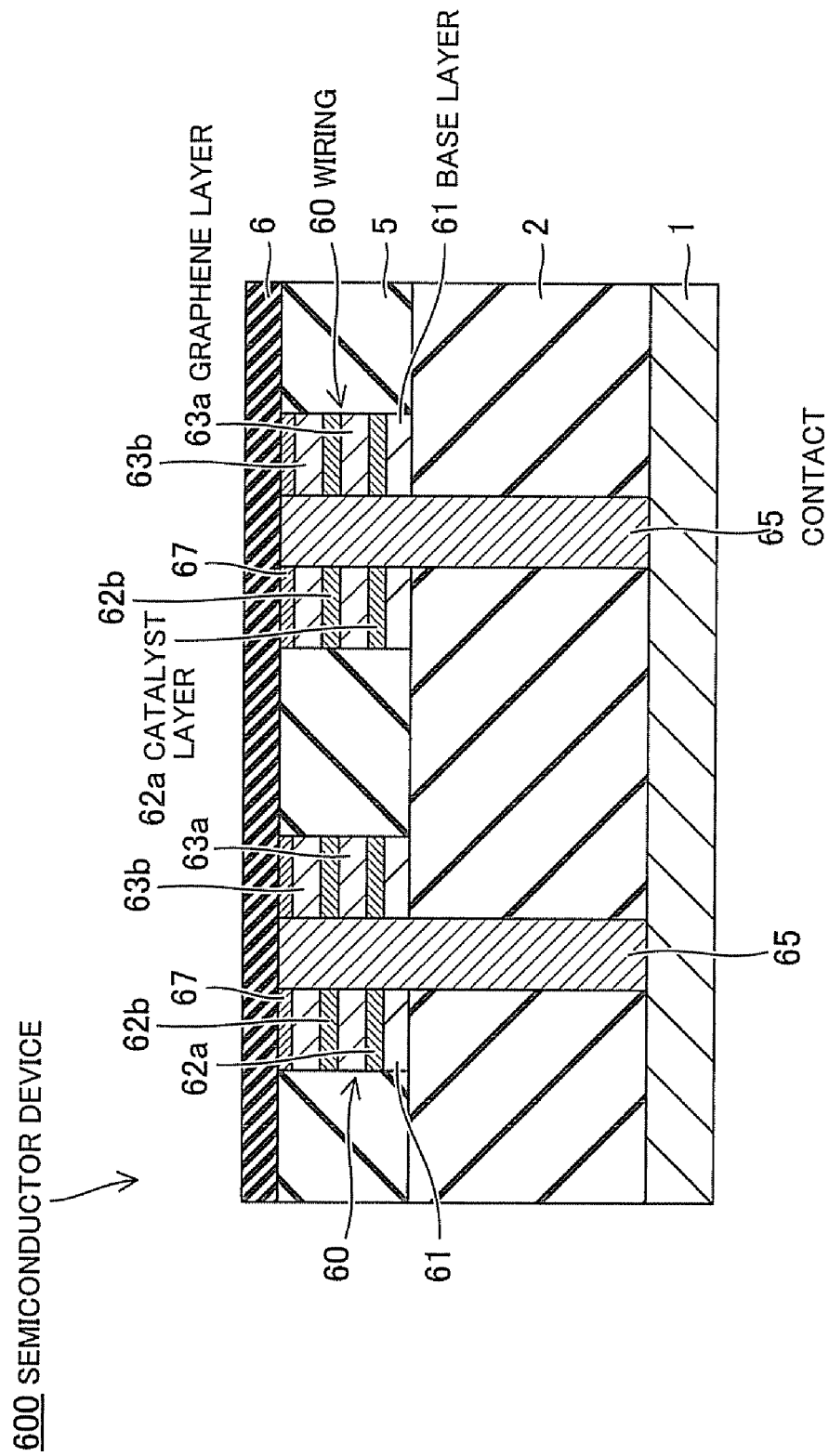
FIG. 17 is a cross sectional view of a semiconductor device according to a sixth embodiment.

FIG. 17 is a cross sectional view of a semiconductor device 600 according to a sixth embodiment.

The semiconductor device 600 has a wiring 60 formed in a wiring layer insulating film 5, a contact 65 formed in a contact layer insulating film 2 for electrically connecting the wiring 60 as an upper layer and a conductive member 1 as a lower layer, and an anti-diffusion film 6 formed on the wiring 60 and the wiring layer insulating film 5.

The wiring 60 contains a base layer 61, a catalyst layer 62a on the base layer 61, a graphene layer 63a on the catalyst layer 62a, a catalyst layer 62b on the graphene layer 63a, a graphene layer 63b on the catalyst layer 62b, and a protective film 67 on the graphene layer 63b.

The base layer 61, the catalyst layer 62a and 62b, the graphene layer 63a and 63b and the protective film 67 each have a planar shape. Note that, the base layer 61, the catalyst layers 62a and 62b and the graphene layers 63a and 63b are respectively made of the same material as the base layer 11, the catalyst layer 12 and the graphene layer 13 in the first embodiment. In addition, the protective film 67 is made of the same material as the protective film 27 in the second embodiment.

The material of the catalyst layer 62a may be the same as or different from that of the catalyst layer 62b.

Alternatively, three or more graphene layers may be formed. A catalyst layer is each formed between the graphene layers in this case as well. In addition, only one graphene layer may be formed. In this case, the catalyst layer 62b and the graphene layer 63a are not formed.

The catalyst layers 62a and 62b are preferably continuous films without break for forming uniform graphene, and preferably have a thickness of 0.5 nm or more.

The graphene layers 63a and 63b are composed of one to several tens of layers of graphene. The graphene layer 63a is made of a graphene which is grown using the catalyst layer 62a as a catalyst and the graphene layer 63b is made of a graphene which is grown using the catalyst layer 62b as a catalyst.

The contact 65 is formed so as to penetrate the wiring 60 in a perpendicular direction. Thus, the contact 65 is directly connected to the graphene layers 63a and 63b. The contact 65 is made of the same material as the contact 3 in the first embodiment.

An example of a method of fabricating the semiconductor device 600 according to the present embodiment will be described hereinafter.

FIGS. 18A to 18D are cross sectional views showing processes for fabricating the semiconductor device 600 according to the sixth embodiment.

Figure 18A:
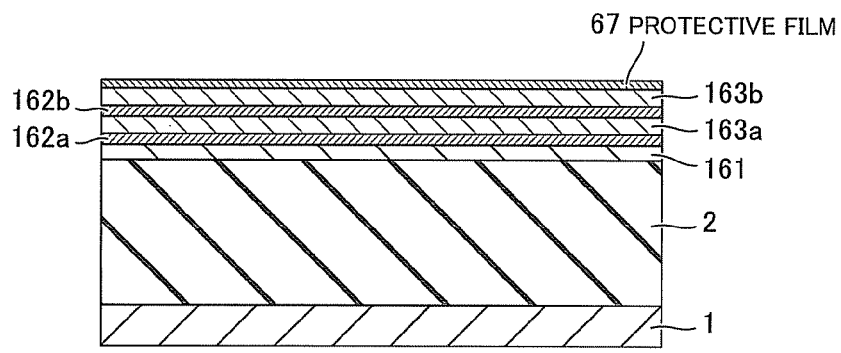
FIGS. 18A to 18D are cross sectional views showing processes for fabricating the semiconductor device according to the sixth embodiment.

Firstly, as shown in FIG. 18A, a contact layer insulating film 2, a base film 161 as a material film of the base layer 61, a catalyst film 162a as a material film of the catalyst layer 62a, a graphene film 163a as a material film of the graphene layer 63a, a catalyst film 162b as a material film of the catalyst layer 62b, a graphene film 163b as a material film of the graphene layer 63b, and a protective film 67 are formed on a conductive member 1.

Figure 18B:
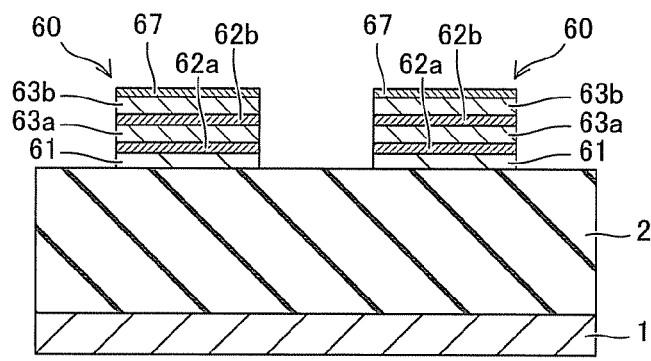

Next, as shown in FIG. 18B, the base film 161, the catalyst film 162a, the graphene film 163a, the catalyst film 162b and the graphene film 163b are patterned by a combination of, e.g., photolithography method and RIE method, and are respectively shaped into the base layer 61, the catalyst layer 62a, the graphene layer 63a, the catalyst layer 62b and the graphene layer 63b. As a result, the wiring 60 is obtained. Note that, it is preferable that a termination process is performed on the end portions of the graphene layers 63a and 63b which are exposed by the patterning.

Figure 18C:
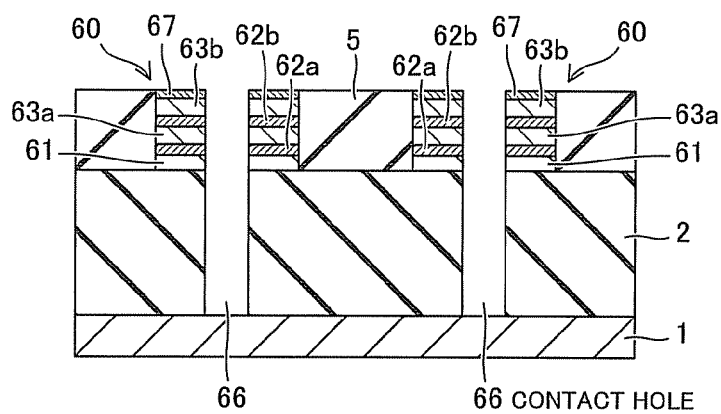

Next, as shown in FIG. 18C, after the wiring layer insulating film 5 is formed by a combination of, e.g., CVD method and the CMP method, a contact hole 66 is formed in the graphene layer 63b, the catalyst layer 62b, the graphene layer 63a, the catalyst layer 62a, the base layer 61 and the contact layer insulating film 2 by a combination of, e.g., photolithography method and RIE method. Note that, the protective film 67 can be used as a stopper for the planarization treatment using CMP method to the wiring layer insulating film 5.

Figure 18D:
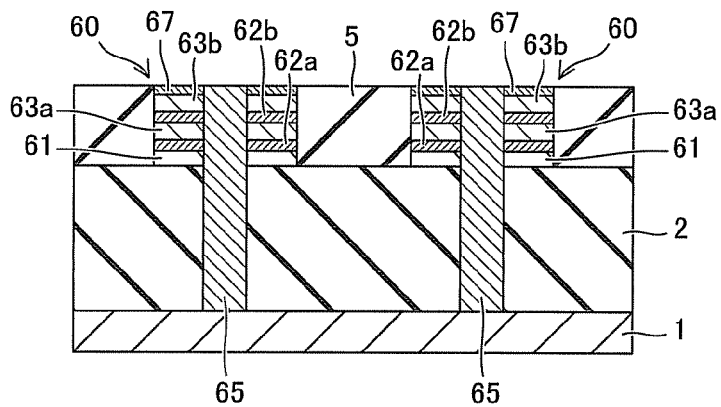

Next, as shown in FIG. 18D, a material film of the contact 65 is filled in the contact hole 66 by CVD method, etc., and the material film outside the contact hole 66 is removed by planarization treatment, thereby forming the contact 65. Note that, the protective film 67 can be used as a stopper for the planarization treatment to the material film of the contact 65.

Alternatively, the formation of the contact hole 66 and the filling of the material film of the contact 65 may be carried out after the deposition of the insulating material of the wiring layer insulating film 5 as well as before the planarization treatment. In this case, the excessive material film of the contact 65 and the excessive insulating material of the wiring layer insulating film 5 above the protective film 67 are removed by the planarization treatment.

After that, the anti-diffusion film 6 is formed on the wiring 60 and the wiring layer insulating film 5. As a result, the semiconductor device 600 shown in FIG. 17 is obtained.

(Effect of the Sixth Embodiment)

According to the sixth embodiment, it is possible to reduce the electric resistance of the wiring 60 by forming the graphene layers 63a and 63b which is a conductive layer of the wiring 60.

In addition, since the wiring 60 is patterned by the RIE method, even when the wiring 60 has a pattern including a bent portion, it is possible to easily maintain the continuity of the graphene layers 63a and 63b at the bent portion, and it is thereby possible to suppress the increase in the electric resistance at the bent portion.

In addition, since the wiring 60 contains two graphene layers 63a and 63b which are graphene layers contributing to electron conduction, it is possible to reduce the electric resistance of the wiring without extending the width of the wiring, compared with the case of using a planar-shaped single graphene layer as a wiring layer.

Seventh Embodiment

The seventh embodiment is different from the sixth embodiment in that a graphene layer is also formed on side surfaces of a wiring. Note that, the explanations will be omitted or simplified for the points same as the sixth embodiment.

Figure 19:
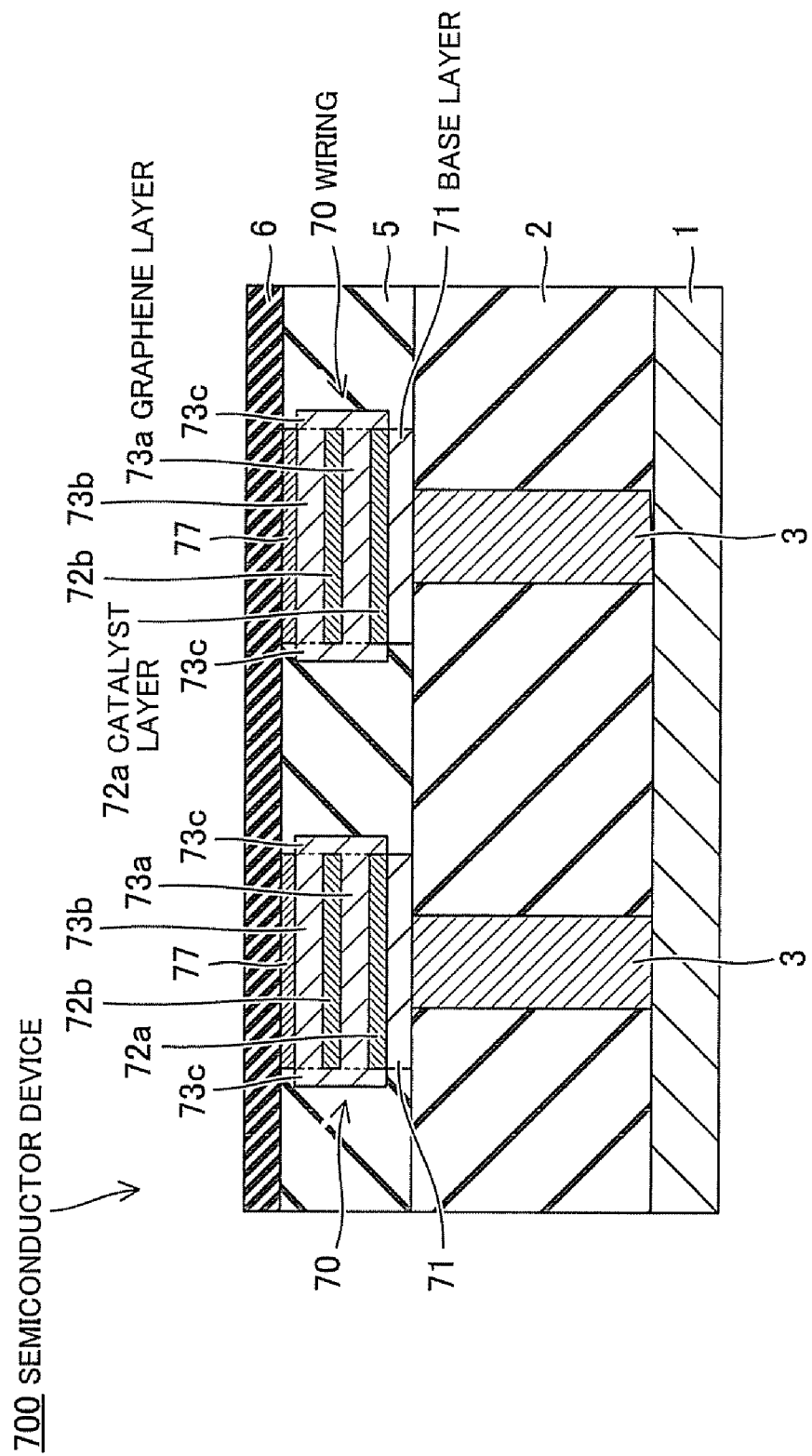
FIG. 19 is a cross sectional view of a semiconductor device according to a seventh embodiment.

FIG. 19 is a cross sectional view of a semiconductor device 700 according to a seventh embodiment.

The semiconductor device 700 has a wiring 70 formed in a wiring layer insulating film 5, a contact 3 formed in a contact layer insulating film 2 for electrically connecting the wiring 70 as an upper layer and a conductive member 1 as a lower layer, and an anti-diffusion film 6 formed on the wiring 70 and the wiring layer insulating film 5.

The wiring 70 contains a base layer 71, a catalyst layer 72a on the base layer 71, a graphene layer 73a on the catalyst layer 72a, a catalyst layer 72b on the graphene layer 73a, a graphene layer 73b on the catalyst layer 72b, a protective film 77 on the graphene layer 73b, and a graphene layer 73c on both side surfaces of the catalyst layers 72a, 72b and the graphene layers 73a, 73b.

The base layer 71, the catalyst layers 72a and 72b, the graphene layers 73a and 73b and the protective film 77 are respectively made of the same material and have the same shape as the base layer 61, the catalyst layers 62a and 62b, the graphene layers 63a and 63b and the protective film 67 in the sixth embodiment.

Alternatively, three or more graphene layers may be formed. A catalyst layer is each formed between the graphene layers in this case as well.

The graphene layer 73c is made of a graphene which is grown from the side surfaces of the catalyst layers 72a and 72b using the catalyst layers 72a and 72b as a catalyst. The graphene layer 73c is in contact with end portions of the graphene layers 73a and 73b, and the graphene layers 73a, 73b and 73c are thus electrically connected.

The contact 3 is the same as that in the first embodiment.

An example of a method of fabricating the semiconductor device 700 according to the present embodiment will be described hereinafter.

Figure 20A:
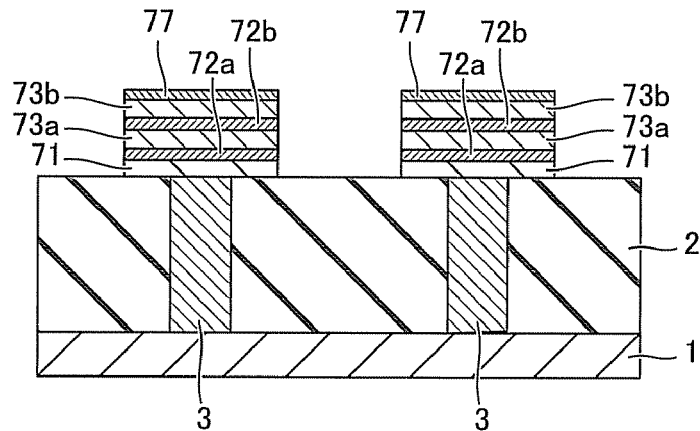
FIGS. 20A to 20C are cross sectional views showing processes for fabricating the semiconductor device according to the seventh embodiment.
Figure 20B:
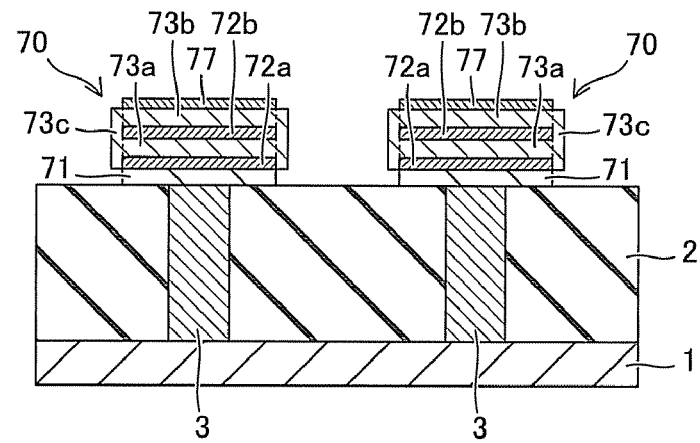
Figure 20C:
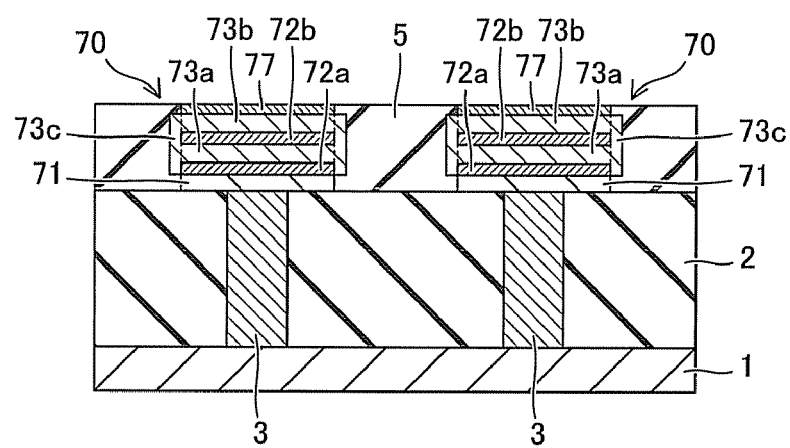

FIGS. 20A to 20C are cross sectional views showing processes for fabricating the semiconductor device 700 according to the seventh embodiment.

Firstly, the contact layer insulating film 2 including the contact 3 is formed on the conductive member 1, and material films of the base layer 71, the catalyst layer 72a, the graphene layer 73a, the catalyst layer 72b and the graphene layer 73b are formed thereon.

Next, as shown in FIG. 20A, the material films of the base layer 71, the catalyst layer 72a, the graphene layer 73a, the catalyst layer 72b and the graphene layer 73b are patterned by a combination of, e.g., photolithography method and RIE method, and are respectively shaped into the base layer 71, the catalyst layer 72a, the graphene layer 73a, the catalyst layer 72b and the graphene layer 73b. In addition, the protective film 77 is also patterned at the same time.

Next, as shown in FIG. 20B, a graphene is grown from the side surfaces of the catalyst layers 72a and 72b, which results in that the graphene layer 73c is formed on the both side surfaces of the catalyst layers 72a, 72b and the graphene layers 73a, 73b. As a result, the wiring 70 is obtained.

Note that, since the graphene layer 73c is formed so as to block the end portions of the graphene layers 73a and 73b which are exposed by the patterning, a termination process for the graphene layers 73a and 73b is not necessary.

Next, as shown in FIG. 20C, an insulating material is deposited on the contact layer insulating film 2 and the wiring 70 by, e.g., CVD method and is subsequently planarized using CMP method, etc., which results in that the wiring layer insulating film 5 is formed. Note that, the protective film 77 can be used as a stopper for the planarization treatment using CMP method to the wiring layer insulating film 5.

After that, the anti-diffusion film 6 is formed on the wiring 70 and the wiring layer insulating film 5. As a result, the semiconductor device 700 shown in FIG. 19 is obtained.

Note that, the graphene layer 73b may be simultaneously formed with the graphene layer 73c. In other words, the graphene layers 73b and 73c are formed by growing a graphene from the upper surface of the catalyst layer 72b and the both side surfaces of the catalyst layers 72a and 72b.

In addition, it is possible to form the graphene layer on the protective film 77 by forming the protective film 77 from the catalyst material. The graphene layer, which is formed on the protective film 77 at the time of forming the graphene layer 73c, is removed at the time of planarization treatment on the wiring layer insulating film 5, however, it is possible to leave a graphene layer on the protective film 77 by growing the graphene again after the planarization treatment. The graphene layer on the protective film 77 is connected to the graphene layers 73a and 73b via the graphene layer 73c.

Alternatively, the anti-diffusion film 6 may be formed by CVD method under the poor coverage condition (e.g., the condition in which a film formation rate is high), without forming the wiring layer insulating film 5. In this case, an air gap is formed between the wirings 70, and it is thus possible to reduce the dielectric constant between the wirings. In addition, since the wiring layer insulating film 5 is not formed, it is possible to reduce the number of processes.

Furthermore, in this case, since the wiring layer insulating film 5 is not formed, the graphene layer is not removed by the planarization treatment in case that the graphene layer is formed on the protective film 77 made of catalyst material. Thus, when the graphene layer 73*a* is formed, it is possible to leave the graphene layer formed on the protective film 77 at the same time, and it is thereby possible to reduce the number of processes.

(Effect of the Seventh Embodiment)

According to the seventh embodiment, the number of the graphene layers which contribute to electron conduction is increased by forming the graphene layer 73*c*, compared with the case of forming only the graphene layers 73*a* and 73*b* without forming the graphene layer 73*c*. As a result, it is possible to reduce the wiring resistance.

In addition, the graphene layer 73*c* is formed, thereby connecting to the end portions of the graphene layers 73*a* and 73*b*. Since the graphene layer does not have an end surface and also continues on the upper surface of the wiring 70 without any breaks, there is no electron scattering at the end surface of the graphene. As a result, it is possible to further reduce the wiring resistance.

In addition, since the graphene layers 73*a*, 73*b* and 73*c* are electrically connected without intervention of other material by forming the graphene layer 73*c*, it is possible to further reduce the wiring resistance.

Note that, the present embodiment may be combined with the sixth embodiment. In this case, for example, after the wiring 60 is formed in the process shown in the sixth embodiment, a graphene layer which corresponds to the graphene layer 73*c* in the present embodiment is formed on the both side surfaces of the wiring 60, and the contact hole 66 is subsequently formed.

Eighth Embodiment

The eighth embodiment is different from the sixth embodiment in that a graphene layer is formed on one catalyst layer. Note that, the explanations will be omitted or simplified for the points same as the sixth embodiment.

Figure 21:
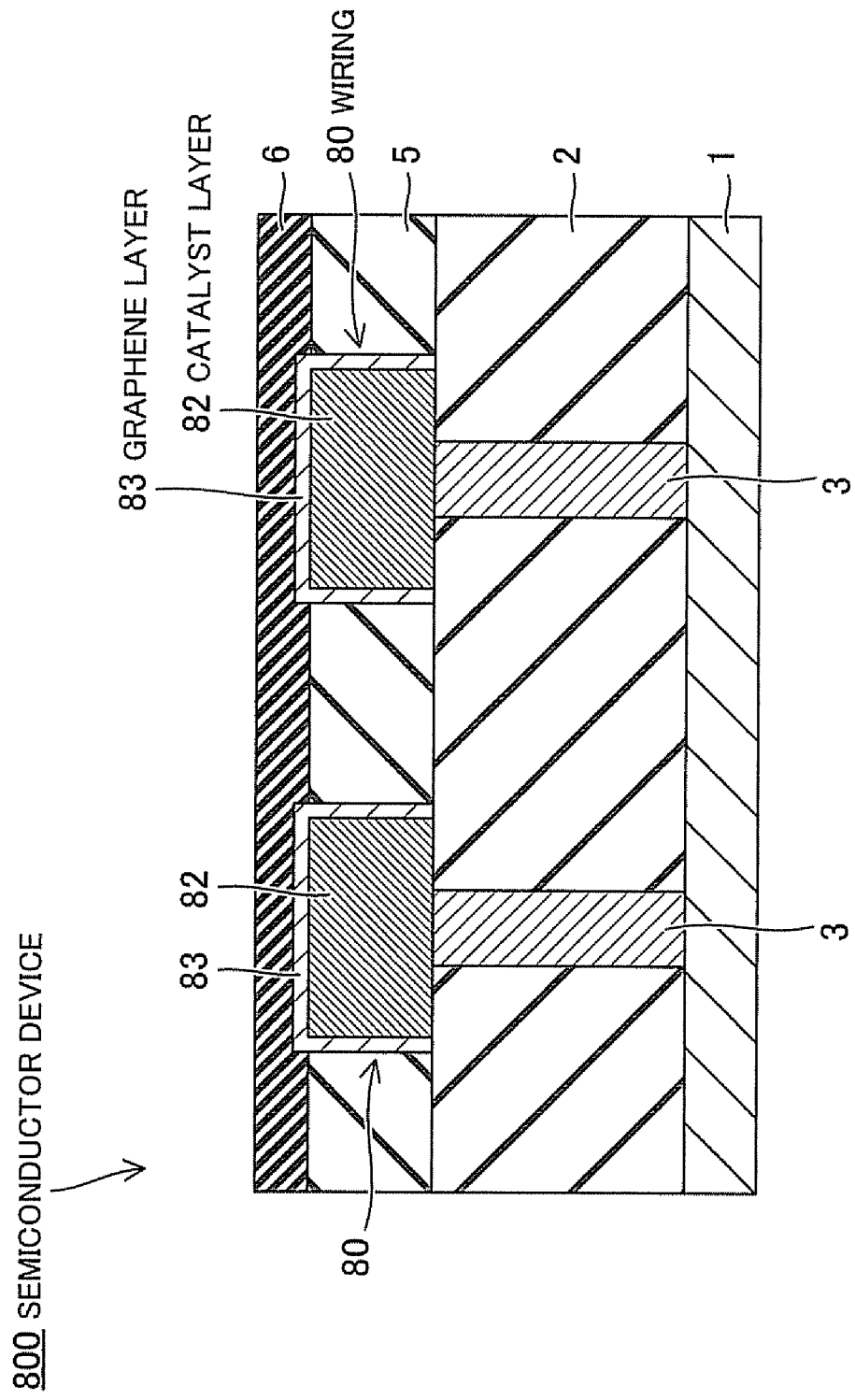
FIG. 21 is a cross sectional view of a semiconductor device according to a eighth embodiment.

FIG. 21 is a cross sectional view of a semiconductor device 800 according to a eighth embodiment.

The semiconductor device 800 has a wiring 80 formed in a wiring layer insulating film 5, a contact 3 formed in a contact layer insulating film 2 for electrically connecting the wiring 80 as an upper layer and a conductive member 1 as a lower layer, and an anti-diffusion film 6 formed on the wiring 80 and the wiring layer insulating film 5.

The wiring 80 contains a catalyst layer 82, and a graphene layer 83 on upper and side surfaces of the catalyst layer 82.

The catalyst layer 82 and the graphene layer 83 are respectively made of the same material as the catalyst layer 62*a* and 62*b* and the graphene layers 63*a* and 63*b* in the sixth embodiment.

The graphene layer 83 is made of a graphene which is grown from the upper and side surfaces of the catalyst layer 82 using the catalyst layer 82 as a catalyst.

An example of a method of fabricating the semiconductor device 800 according to the present embodiment will be described hereinafter.

FIGS. 22A to 22D are cross sectional views showing processes for fabricating the semiconductor device 800 according to the eighth embodiment;

Firstly, the contact layer insulating film 2 including the contact 3 is formed on the conductive member 1, and a material film of the catalyst layer 82 is formed thereon.

Figure 22A:
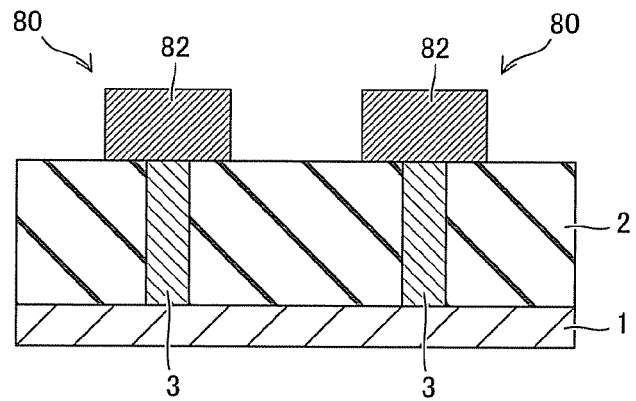
FIGS. 22A to 22D are cross sectional views showing processes for fabricating the semiconductor device according to the eighth embodiment.

Next, as shown in FIG. 22A, the material film of the catalyst layer 82 is patterned by a combination of, e.g., photolithography method and RIE method, and is shaped into the catalyst layer 82.

Figure 22B:
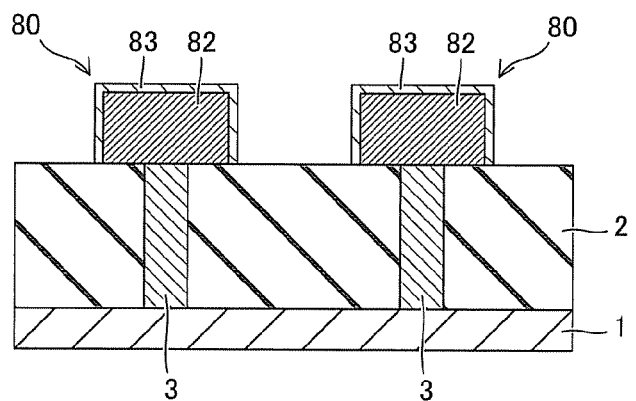

Next, as shown in FIG. 22B, a graphene is grown from the upper side surfaces of the catalyst layer 82, which results in that the graphene layer 83 is formed. As a result, the wiring 80 is obtained.

Figure 22C:
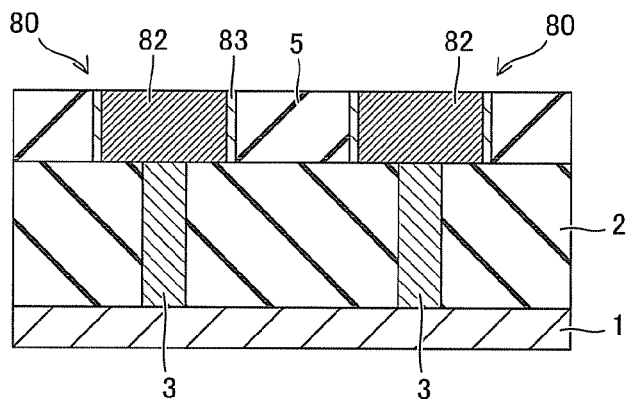

Next, as shown in FIG. 22C, the insulating material is deposited on the contact layer insulating film 2 and the wiring 80 by, e.g., CVD method and is subsequently planarized using the CMP method, etc., which results in that the wiring layer insulating film 5 is formed. At this time, the graphene layer 83 on the upper surface of the catalyst layer 82 is removed by the planarization treatment.

Figure 22D:
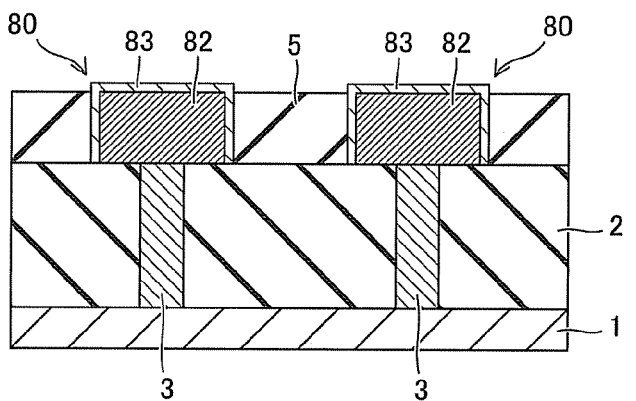

Next, as shown in FIG. 22D, the graphene is grown again from the upper surface of the catalyst layer 82, thereby forming the graphene layer 83 on the upper surface of the catalyst layer 82.

After that, the anti-diffusion film 6 is formed on the wiring 80 and the wiring layer insulating film 5. As a result, the semiconductor device 800 shown in FIG. 21 is obtained.

Alternatively, the anti-diffusion film 6 may be formed by CVD method under the poor coverage condition without forming the wiring layer insulating film 5. In this case, an air gap is formed between the wirings 80, and it is thus possible to reduce the dielectric constant between the wirings. In addition, since the wiring layer insulating film 5 is not formed, it is possible to reduce the number of processes.

Furthermore, in this case, since the wiring layer insulating film 5 is not formed, the graphene layer 83 on the upper surface of the catalyst layer 82 is not removed by planarization treatment. Therefore, it is not necessary to grow the graphene again, and it is thereby possible to reduce the number of processes.

(Effect of the Eighth Embodiment)

According to the eighth embodiment, it is possible to form the graphene layer 83 on the upper and side surfaces of the catalyst layer 82 by forming the catalyst layer 82 to be a certain level of thickness. As a result, it is possible to reduce the wiring resistance.

Ninth Embodiment

The ninth embodiment is different from the first embodiment in that a wiring has a dual-damascene structure. Note that, the explanations will be omitted or simplified for the points same as the first embodiment.

Figure 23:
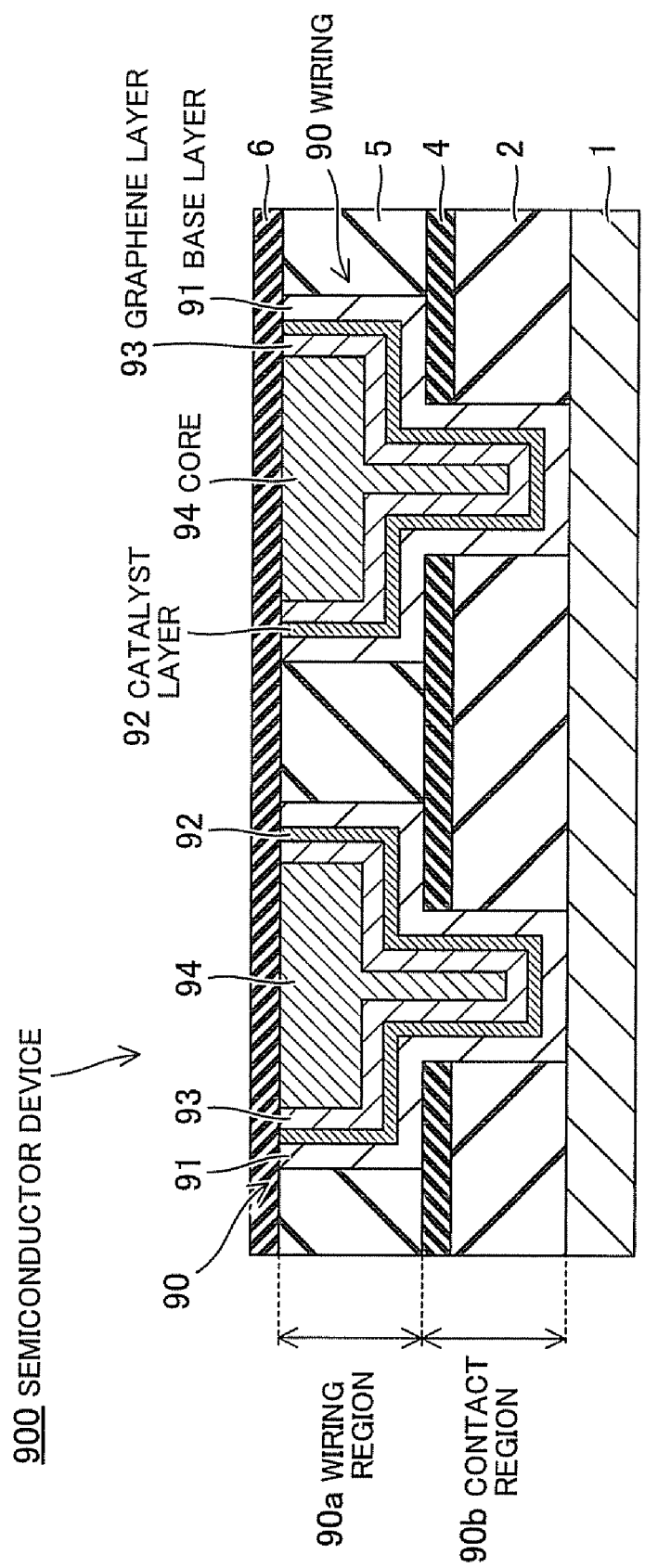
FIG. 23 is a cross sectional view of a semiconductor device according to a ninth embodiment.

FIG. 23 is a cross sectional view of a semiconductor device 900 according to a ninth embodiment.

The semiconductor device 900 has a wiring 90 which is formed in a contact layer insulating film 2 and a wiring layer insulating film 5, is electrically connected to a lower conductive member 1 and has a dual-damascene structure, an etching stopper film 4 formed between the contact layer insulating film 2 and the wiring layer insulating film 5, and an anti-diffusion film 6 formed on the wiring 90 and the wiring layer insulating film 5. Alternatively, the etching stopper film 4 may not be formed.

The wiring 90 contains a wiring region 90a formed in the wiring layer insulating film 5, and a contact region 90b formed in the contact layer insulating film 2 and the etching stopper film 4.

The wiring region 90a contains a core 94, a graphene layer 93 which is in contact with a bottom surface and both side surfaces of the core 94, a catalyst layer 92 which is in contact with a bottom surface and both side surfaces of the graphene layer 93, and a base layer 91 which is in contact with a bottom surface and both side surfaces of the catalyst layer 92. In addition, when the void in the wiring region 90a is filled only by the base layer 91, the catalyst layer 92 and the graphene layer 93 or when the void can exist in the wiring region 90a, the core 94 may not be formed in the wiring region 90a.

Similarly to the wiring region 90a, the contact region 90b contains a core 94, a graphene layer 93 which is in contact with a bottom surface and both side surfaces of the core 94, a catalyst layer 92 which is in contact with a bottom surface and both side surfaces of the graphene layer 93, and a base layer 91 which is in contact with a bottom surface and both side surfaces of the catalyst layer 92. In addition, when the void in the contact region 90b is filled only by the base layer 91, the catalyst layer 92 and the graphene layer 93 or when the void can exist, the core 94 may not be formed in the contact region 90b.

The base layer 91, the catalyst layer 92, the graphene layer 93a and the core 94 are respectively made of the same material as the base layer 11, the catalyst layer 12, the graphene layer 13 and the core 14 in the first embodiment.

An example of a method of fabricating the semiconductor device 900 according to the present embodiment will be described hereinafter.

FIGS. 24A to 24D are cross sectional views showing processes for fabricating the semiconductor device 900 according to the ninth embodiment.

Figure 24A:
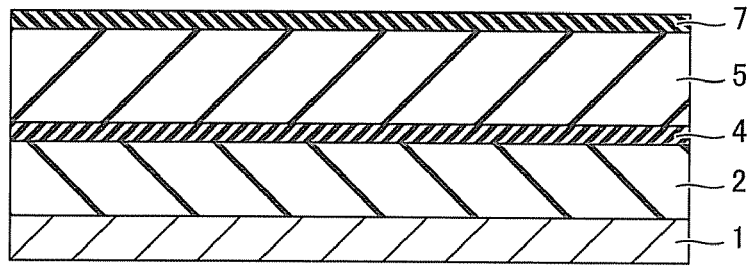
FIGS. 24A to 24D are cross sectional views showing processes for fabricating the semiconductor device according to the ninth embodiment.

Firstly, as shown in FIG. 24A, a contact layer insulating film 2, an etching stopper film 4, a wiring layer insulating film 5 and a cap layer 7 are formed on a conductive member 1. Note that, the etching stopper film 4 may not be formed.

Figure 24B:
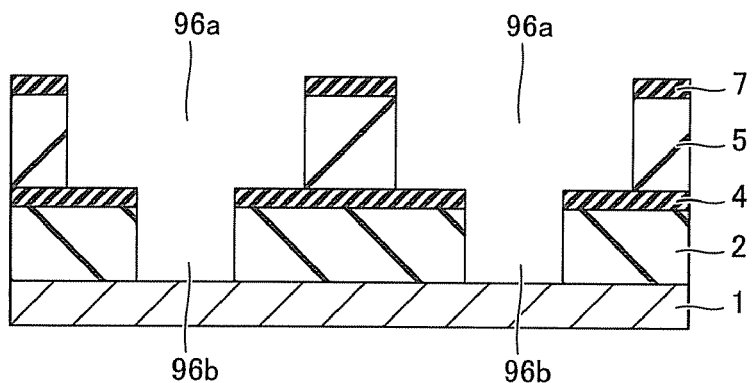

Next, as shown in FIG. 24B, a contact hole 96b is formed in the contact layer insulating film 2 and the etching stopper film 4 by a combination of, e.g., photolithography method and RIE method, then, a wiring trench 96a is formed in the wiring layer insulating film 5 and the cap layer 7.

Figure 24C:
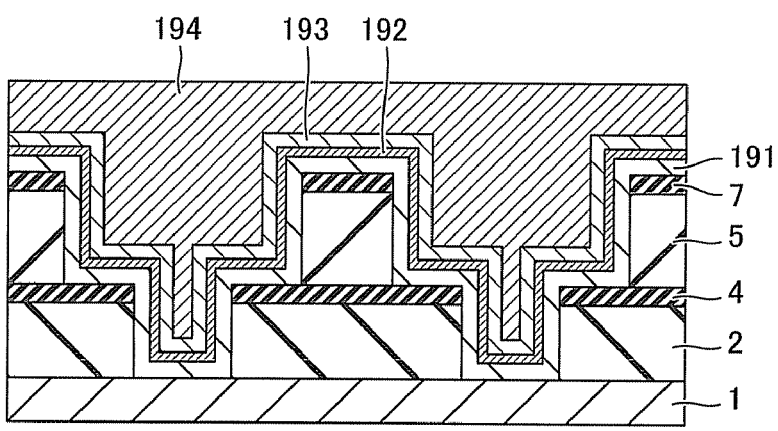

Next, as shown in FIG. 24C, a material film 191 as a material film of the base layer 91, a catalyst film 192 as a material film of the catalyst layer 92, a graphene film 193 as a material film of the graphene layer 93 and a material film 194 as a material film of the core 94 are formed so as to fill the contact hole 96b and the wiring trench 96a.

Figure 24D:
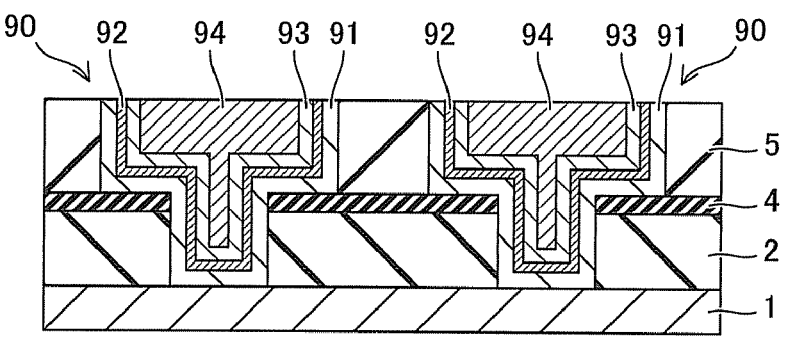

Next, as shown in FIG. 24D, the material film 194, the graphene film 193, the catalyst film 192 and the base film 191 outside the wiring trench 96a are removed by a planarization treatment such as CMP using the cap layer 7 as a stopper, thereby forming the core 94, the graphene layer 93, the catalyst layer 92 and the base layer 91. As a result, the wiring 90 is obtained. The cap layer 7 may be left without being removed at this time, however, it is preferable to remove in order to reduce dielectric constant between the wirings.

Note that, it is preferable that a termination process is performed on the exposed end portion of the graphene layer 93 on the upper surface of the wiring 90 after the planarization treatment.

After that, the anti-diffusion film 6 is formed on the wiring 90 and the wiring layer insulating film 5.

(Effect of the Ninth Embodiment)

According to the ninth embodiment, it is possible to reduce the electric resistance of the wiring 90 by forming the graphene layer 93 which is a conductive layer of the wiring 90.

In addition, even when the wiring 90 has a pattern including a bent portion, it is relatively easy to continuously form the graphene layer 93 at the bent portion, and it is thereby possible to suppress the increase in the electric resistance at the bent portion.

Alternatively, a graphene layer corresponding to the graphene layer 33 in the third embodiment may be formed in the wiring 90 by combining the present embodiment with the third embodiment. In addition, multiple graphene layers may be formed in the same process as the fourth embodiment.

Other Embodiments

It should be noted that the present invention is not intended to be limited to the above-mentioned embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A semiconductor device, comprising:
   a semiconductor substrate;
   an insulating film provided above the semiconductor substrate and containing a wiring trench;
   a first catalyst layer provided directly or via another member on side and bottom surfaces of the wiring trench;
   a first graphene layer provided in the wiring trench so as to be along the side and bottom surface of the wiring trench, the first graphene layer being provided on the first catalyst layer so as to be in contact with the first catalyst layer;
   a second catalyst layer provided on the first graphene layer in the wiring trench; and
   a second graphene layer provided on the second catalyst layer in the wiring trench so as to be in contact with the second catalyst layer.

2. The semiconductor device according to claim 1, further comprising:
   a core provided inside the second graphene layer in the wiring trench.

3. The semiconductor device according to claim 2, wherein the core comprises a catalyst material in an upper surface thereof, the catalyst material functioning as catalyst of graphene; and
   the semiconductor device further comprises a third graphene layer provided so as to be in contact with the upper surface of the core and end portions of the first and second graphene layers.

4. The semiconductor device according to claim 1, wherein a contact connecting a wiring to a conductive member therebelow is directly connected to the first and second graphene layers, the wiring being composed of the first and second catalyst layers and the first and second graphene layers.

5. The semiconductor device according to claim 1, wherein a bent portion of a pattern of a wiring composed of the first and second catalyst layers and the first and second graphene layers has a rounded shape in a plan view.

6. A semiconductor device, comprising:
a semiconductor substrate;
an insulating film provided above the semiconductor substrate and containing a wiring trench;
a first catalyst layer provided directly or via another member on side and bottom surfaces of the wiring trench;
a first graphene layer provided in the wiring trench so as to be along the side and bottom surface of the wiring trench, the first graphene layer being provided on the first catalyst layer so as to be in contact with the first catalyst layer; and
a core provided inside the first graphene layer in the wiring trench,
wherein the core comprises a catalyst material in an upper surface thereof, the catalyst material functioning as catalyst of graphene; and
the first graphene layer is in contact with the upper surface, a bottom surface and both side surfaces of the core.

7. A semiconductor device, comprising:
a semiconductor substrate;
an insulating film provided above the semiconductor substrate and containing a wiring trench;
a first catalyst layer provided directly or via another member on side and bottom surfaces of the wiring trench;
a first graphene layer provided in the wiring trench so as to be along the side and bottom surface of the wiring trench, the first graphene layer being provided on the first catalyst layer so as to be in contact with the first catalyst layer; and
a core provided inside the first graphene layer in the wiring trench,
wherein a contact connecting a wiring to a conductive member therebelow is directly connected to the first graphene layer, the wiring being composed of the first catalyst layer and the first graphene layer.

8. A semiconductor device, comprising:
a semiconductor substrate;
an insulating film provided above the semiconductor substrate and containing a wiring trench;
a first catalyst layer provided directly or via another member on side and bottom surfaces of the wiring trench; and
a first graphene layer provided in the wiring trench so as to be along the side and bottom surface of the wiring trench, the first graphene layer being provided on the first catalyst layer so as to be in contact with the first catalyst layer,
wherein a bent portion of a pattern of a wiring composed of the first catalyst layer and the first graphene layer has a rounded shape in a plan view.

9. A semiconductor device, comprising:
a semiconductor substrate;
an insulating film provided above the semiconductor substrate and containing a wiring trench;
a first catalyst layer provided directly or via another member on side and bottom surfaces of the wiring trench; and
a first graphene layer provided in the wiring trench so as to be along the side and bottom surface of the wiring trench, the first graphene layer being provided on the first catalyst layer so as to be in contact with the first catalyst layer,
wherein the first catalyst layer and the first graphene layer are formed in the wiring trench and a contact hole therebelow, and compose a dual-damascene interconnect.

10. The semiconductor device according to claim 9, further comprising:
a core provided inside the first graphene layer in the wiring trench.

11. The semiconductor device according to claim 10, wherein the core comprises a catalyst material in an upper surface thereof, the catalyst material functioning as catalyst of graphene; and
the semiconductor device further comprises a third graphene layer provided so as to be in contact with the upper surface of the core and end portions of the first and second graphene layers.

12. A semiconductor device, comprising:
a wiring comprising a first catalyst layer, a first graphene layer formed on the first catalyst layer, a second catalyst layer formed on the first graphene layer, and a second graphene layer formed on the second catalyst layer, the first catalyst layer comprising a first catalyst material, the first graphene layer comprising a graphene grown using the first catalyst material as a catalyst, the second catalyst layer comprising a second catalyst material, and the second graphene layer comprising a graphene grown using the second catalyst material as a catalyst.

13. The semiconductor device according to claim 12, wherein the first and second catalyst layers and the first and second graphene layers have a planar shape.

14. The semiconductor device according to claim 13, wherein a contact connecting the wiring to a conductive member therebelow is directly connected to the first and second graphene layers.

15. The semiconductor device according to claim 14, further comprising:
a third graphene layer provided on side surfaces of the first and second catalyst layers and the first and second graphene layers so as to be in contact with end portions of the first and second graphene layers.

16. The semiconductor device according to claim 13, further comprising:
a third graphene layer provided on side surfaces of the first and second catalyst layers and the first and second graphene layers so as to be in contact with end portions of the first and second graphene layers.

17. A semiconductor device, comprising:
a wiring comprising a catalyst layer comprising a catalyst material and a graphene layer formed on an upper surface and a side surface of the catalyst layer, the graphene layer comprising a graphene grown using the catalyst material as a catalyst.

* * * * *